United States Patent
Eun et al.

(10) Patent No.: US 11,380,418 B2
(45) Date of Patent: Jul. 5, 2022

(54) MEMORY CONTROLLERS, STORAGE DEVICES, AND OPERATING METHODS OF THE STORAGE DEVICES

(71) Applicant: Samsung Electronics Co., Ltd., Suwon-si (KR)

(72) Inventors: Hyunglae Eun, Seongnam-si (KR); Dong Kim, Busan (KR); Inhoon Park, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 17/019,929

(22) Filed: Sep. 14, 2020

(65) Prior Publication Data

US 2021/0090678 A1 Mar. 25, 2021

(30) Foreign Application Priority Data

Sep. 20, 2019 (KR) .................. 10-2019-0116356
Feb. 12, 2020 (KR) .................. 10-2020-0017144

(51) Int. Cl.
*G11C 29/00* (2006.01)
*G11C 29/42* (2006.01)
*G11C 29/44* (2006.01)
*G06F 8/656* (2018.01)

(52) U.S. Cl.
CPC .............. *G11C 29/44* (2013.01); *G06F 8/656* (2018.02); *G11C 29/42* (2013.01); *G11C 29/785* (2013.01)

(58) Field of Classification Search
CPC ....... G11C 29/44; G11C 29/42; G11C 29/785; G06F 8/656

USPC ...................................................... 365/185.09
See application file for complete search history.

(56) References Cited

U.S. PATENT DOCUMENTS

| | | | |
|---|---|---|---|
| 5,623,470 A | 4/1997 | Asthana et al. | |
| 8,413,013 B2 | 4/2013 | Toda | |
| 9,804,917 B2 | 10/2017 | Walton | |
| 2010/0005202 A1* | 1/2010 | Ferraiolo | G06F 11/2017 710/51 |
| 2010/0169750 A1* | 7/2010 | Chew | G06F 21/572 714/807 |
| 2014/0258780 A1 | 9/2014 | Eyres | |
| 2018/0089047 A1* | 3/2018 | Cooper | G06F 13/4068 |
| 2019/0236277 A1* | 8/2019 | Chang | G06F 8/654 |
| 2020/0104221 A1* | 4/2020 | Kost | G11C 29/027 |

(Continued)

FOREIGN PATENT DOCUMENTS

| | | | | |
|---|---|---|---|---|
| CN | 112540869 A | * | 3/2021 | ............ G06F 8/656 |
| JP | 2002-215337 A | | 8/2002 | |
| JP | 2004246699 A | * | 9/2004 | |

(Continued)

*Primary Examiner* — Ly D Pham
(74) *Attorney, Agent, or Firm* — Harness, Dickey & Pierce, P.L.C.

(57) ABSTRACT

A storage device includes a non-volatile memory; a volatile memory; and a memory controller configured to control the non-volatile memory and the volatile memory. The memory controller is configured to, in response to a determination that a progressive defect has occurred in at least one memory of the non-volatile memory or the volatile memory during an operation of the storage device, such that the at least one memory is determined to be a defective memory, perform a repair operation on the defective memory based on executing a memory revival firmware.

20 Claims, 16 Drawing Sheets

(56) References Cited

U.S. PATENT DOCUMENTS

2021/0271604 A1* 9/2021 Cariello .............. G06F 11/0772
2021/0312055 A1* 10/2021 Kloth .................... G06F 3/0623

FOREIGN PATENT DOCUMENTS

| KR | 10-2015-0029400 A | | 3/2015 | | |
|----|-------------------|---|--------|---|---|
| KR | 10-2015-0116073 A | | 10/2015 | | |
| TW | I276107 B | * | 3/2007 | .............. | G06F 11/27 |
| WO | WO-2015199700 A1 | * | 12/2015 | ......... | G11C 14/0018 |

* cited by examiner

MEMORY CONTROLLERS, STORAGE DEVICES, AND OPERATING METHODS OF THE STORAGE DEVICES

CROSS-REFERENCE TO RELATED APPLICATIONS

This application claims the benefit, under 35 U.S.C. § 119, of Korean Patent Application No. 10-2019-0116356, filed on Sep. 20, 2019 in the Korean Intellectual Property Office, and Korean Patent Application No. 10-2020-0017144, filed on Feb. 12, 2020 in the Korean Intellectual Property Office, the disclosures of each of which are incorporated herein in their entirety by reference.

BACKGROUND

The inventive concepts relate to storage devices, and more particularly, to memory controllers capable of managing defective memories, storage devices including the memory controllers, and operating methods of the storage devices.

Recently, storage devices, such as a solid state drive (SSD), have been widely used, and the storage devices are used to store or move a large amount of data. Due to various reasons, some of the memories included in the storage devices may be exposed to progressive defects, and thus, an issue that the storage devices need to be replaced may occur.

SUMMARY

According to some example embodiments, a storage device may include a non-volatile memory, a volatile memory, and a memory controller configured to control the non-volatile memory and the volatile memory. The memory controller may be further configured to, in response to a determination that a progressive defect has occurred in at least one memory of the non-volatile memory or the volatile memory during an operation of the storage device, such that the at least one memory is determined to be a defective memory, perform a repair operation on the defective memory based on executing a memory revival firmware.

According to some example embodiments, an operating method of a storage device, the storage device including a non-volatile memory, a volatile memory, and a memory controller, may include detecting, by the memory controller, a progressive defect in a memory of the non-volatile memory or the volatile memory, such that the memory in which the progressive defect is detected is determined to be a defective memory, entering, by the memory controller, a memory test mode in response to the detecting the progressive defect, and performing, by the memory controller, a repair operation on the defective memory based on executing memory revival firmware in the memory test mode.

According to some example embodiments, a memory controller configured to control a memory may include a memory interface configured to transceive data with the memory, an error checking and correcting (ECC) engine configured to correct an error of data read from the memory, and memory revival firmware configured to perform a repair operation on the memory in response to a determination, by the memory controller, that an uncorrectable error has occurred in the memory, the uncorrectable error being an error that the ECC engine is not capable of correcting.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
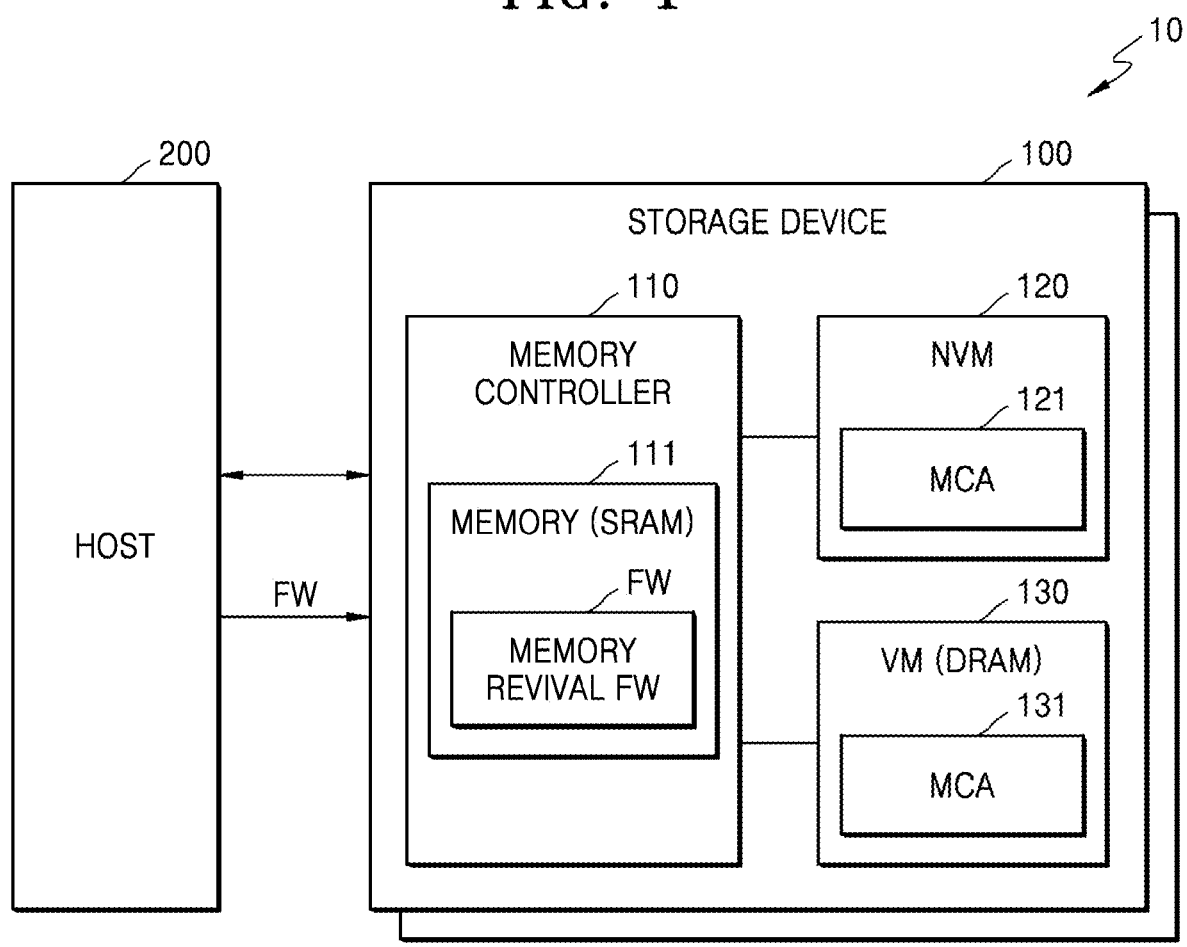
FIG. 1 is a block diagram illustrating a storage system according to some example embodiments.

Hereinafter, some example embodiments of the inventive concepts are described in detail with reference to the accompanying drawings.

It will be understood that elements, which may include devices and/or operations, and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements, which may include devices and/or operations, and/or properties thereof described herein as being "substantially" the same encompasses elements and/or properties thereof that are the same within manufacturing tolerances and/or material tolerances and/or elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof (e.g., structures, properties of one or more elements, lengths, distances, parallel or perpendicular arrangement, or the like).

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

It will be understood that some or all of any of the devices, controllers, memories, engines, interfaces, firmware, decoders, units, modules, or the like according to any of the example embodiments as described herein, including some or all of any of the elements of the storage system 10, storage device 100, storage device 100', host 200, host 200', memory controller 110, memory controller 110', memory 111, ECC engine 113, non-volatile memory (NVM), volatile memory (VM), memory revival firmware, network system 1000, any combination thereof, or the like may be included in, may include, and/or may be implemented by one or more instances of processing circuitry such as hardware including logic circuits, a hardware/software combination such as a processor executing software; or a combination thereof. In some example embodiments, said one or more instances of processing circuitry may include, but are not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, any of the memories, memory units, or the like as described herein may include a non-transitory computer readable storage device, for example a solid state drive (SSD), storing a program of instructions, and the one or more instances of processing circuitry may be configured to execute the program of instructions to implement the functionality of some or all of any of the devices, controllers, memories, engines, interfaces, firmware, decoders, units, modules, or the like according to any of the example embodiments as described herein, including any of the methods of operating any of same as described herein.

FIG. 1 is a block diagram illustrating a storage system 10 according to some example embodiments.

Referring to FIG. 1, the storage system 10 may include a storage device 100 and a host 200, and the storage device 100 may include a memory controller 110 and a non-volatile memory (NVM) 120 (also referred to interchangeably herein as a non-volatile memory device). In addition, the storage device 100 may further include a volatile memory (VM) 130 (also referred to interchangeably herein as a volatile memory device). In some example embodiments, the storage system 10 may include a plurality of storage devices 100. The memory controller 110 may be configured to control the NVM 120 and the VM 130, for example to control memory read operations and/or memory write operations at one or more of the NVM 120 or the VM 130.

It will be understood that any operations described herein as being performed by the storage device 100 may be implemented at least in part or in full by the memory controller 110. Any part of the storage device 100 (e.g., the memory controller 110) may be configured to perform some or all of any operations of any methods described with regard to any example embodiments herein, for example based on memory controller 110 including a memory storing a program of instructions and processing circuitry configured to execute the program of instructions to implement some or all of any operations of any methods described with regard to any example embodiments herein.

The host 200 may communicate with the storage device 100 via various interfaces, and may transfer a write request, a read request, or the like to the storage device 100. In some example embodiments, the host 200 may include a server or a personal computer (PC). In some example embodiments, the host 200 may be implemented with an application processor (AP) or a system-on-a-chip (SoC). The memory controller 110 may control the NVM 120 so that data stored in the NVM 120 is read in response to a read request from the host 200 or data is written to the NVM 120 in response to a write request from the host 200.

The memory controller 110 may include a memory 111, and the memory 111 may be referred to as an internal memory, an operation memory, or the like. For example, the memory 111 may be static random access memory (RAM) SRAM, and hereinafter, descriptions are given mainly on some example embodiments in which the memory 111 is SRAM. However, some example embodiments are not limited thereto, and the memory 111 may include other VMs or NVMs other than SRAM.

The NVM 120 may include a memory cell array (MCA) 121 in which a plurality of memory cells are arranged. For example, the NVM 120 may include a 3D vertical NAND flash memory device. In some example embodiments, the MCA 121 may include flash memory cells, and the flash memory cells may include, for example, NAND flash memory cells. However, the inventive concepts are not limited thereto, and the memory cells may include resistive memory cells such as resistive RAM (ReRAM), phase change RAM (PRAM), and magnetic RAM (MRAM).

The VM 130 may include an MCA 131 in which a plurality of memory cells are arranged. For example, the VM 130 may include dynamic RAM (DRAM), and hereinafter, descriptions are given mainly on some example embodiments in which the VM 130 includes DRAM. However, some example embodiments are not limited thereto, and the VM 130 may include other VMs other than DRAM.

In this manner, the storage device 100 may include various memories such as the NVM 120, the VM 130, and the memory 111, and in the memory cells included in the various memories, defects may occur not only in a manufacturing process phase but also a product utilization phase. Hereinafter, a defect occurring in the manufacturing process phase may be referred to as an "initial defect", and a defect occurring in the product utilization phase may be referred to as a "progressive defect." For example, a threshold voltage distribution of the memory cell may change due to the progressive defect of the NVM 120, and accordingly, the reliability of the NVM 120 and the storage device 100 including the NVM 120 may be reduced.

After the storage device 100 is shipped out, a progressive defect may occur in some of the various memories included in the storage device 100. According to some example embodiments, when there is a defective memory in the storage device 100 (e.g., in response to a determination, for example by the memory controller 110 that a progressive defect has occurred at a memory in the storage device 100, such that said memory is determined to be a defective memory), the storage device 100 may, in response, perform a repair operation on the defective memory based on executing memory revival firmware FW. In some example embodiments, the storage device 100 may receive (e.g., download) the memory revival firmware FW from the host 200, perform the repair operation on the defective memory based on executing the received memory revival firmware FW, and reuse the defective memory on which the repair operation has been performed.

It will be understood that, as described herein, a determination that a progressive defect has occurred at a memory of the storage device, such that said memory is determined to be a defective memory, may be interchangeably referred to herein detecting a progressive defect in the memory such that said memory is determined to be a defective memory, detecting the defective memory, or the like.

When a defective memory is detected (e.g., in response to said detection by the memory controller 110, in response to a determination at the memory controller 110 that a progressive defect has occurred at a memory, such that the memory is determined to be the defective memory), the storage device 100 may transfer information about (e.g., associated with) the progressive defect to the host 200. For example, the information about the progressive defect may include information about the occurrence of the defective memory. In addition, for example, the information about the progressive defect may include information about a type or attribute of the memory in which the progressive defect has occurred. Subsequently (e.g., in response to the detection of the defective memory and/or in response to transferring the information to the host 200), the storage device 100 may enter a firmware downloadable mode or a memory test mode. The firmware downloadable mode or the memory test mode may be referred to as a mode in which the storage device 100 may be controlled by using an in-band command through Non-Volatile Memory (NVM) express (NVMe), serial advanced technology attachment (SATA), Serial Attached SCSI (small computer system interface) (SAS), or the like.

For example, when the storage device 100 detects (e.g., in response to a determination by the memory controller 110 that there is an occurrence of) an uncorrectable error correcting code (ECC) (UECC) in at least one of various memories, such as the NVM 120, the VM 130, and/or the memory 111, the storage device 100 (e.g., the memory controller 110) may determine the memory in which the UECC occurs, as the defective memory. In some example embodiments, the storage device 100 may transfer information about the defect, which includes information about the attribute or type of the memory in which the UECC occurs, to the host 200.

The host 200 may provide (e.g., transfer) the memory revival firmware FW to the storage device 100 in response to the information about the defect received from the storage device 100, for example based on the host processing the information to select a particular memory revival firmware FW that corresponds to one or more portions of the information. In some example embodiments, the memory revival firmware FW may be referred to as firmware for performing a test and repair of the defective memory. The memory revival firmware FW may be configured to perform an in-depth attribute analysis on a defective cell included in the defective memory, and accordingly, may repair the defective cell.

In some example embodiments, the host 200 may select the memory revival firmware FW as a particular memory revival firmware FW selected from among different pieces of memory revival firmware FW, based on the attribute or type of the defective memory, which may be indicated by the information about the progressive defect and which may be determined by the host 200 based on processing the information. The host 200 may provide (e.g., transfer) the selected memory revival firmware FW to the storage device 100. However, the inventive concepts are not limited thereto, and the host 200 may provide the memory revival firmware FW applicable to various memories to the storage device 100.

As described herein, a transfer of data between two devices (e.g., a transfer of memory revival firmware FW from host 200 to storage device 100) may be implemented based on the receiving device accessing and/or "pulling" (e.g., downloading) the data from the sending device, based on the sending device "pushing" the data to the receiving device, any combination thereof, or the like.

The storage device 100 (e.g., the memory controller 110) may store the memory revival firmware FW received (e.g., downloaded) from the host 200. In some example embodiments, the storage device 100 may store the memory revival firmware FW in the memory 111. For example, the memory revival firmware FW stored in the memory 111 may include multiple, different pieces of memory revival firmware, including volatile memory (e.g., DRAM) revival firmware (e.g., first memory revival firmware configured to execute a first repair program on volatile memories) and/or non-volatile memory revival firmware (e.g., second memory revival firmware configured to execute a second repair program on non-volatile memories). However, the inventive concepts are not limited thereto, and the memory revival firmware FW stored in the memory 111 may include memory revival firmware applicable to various memories (e.g., first memory revival firmware configured to execute a repair program on one or both of volatile or non-volatile memories).

In some example embodiments, the storage device 100 may store the memory revival firmware FW in the VM 130. For example, the memory revival firmware FW stored in the VM 130 may include SRAM revival firmware (e.g., memory revival firmware configured to execute a repair program on SRAM) and/or NVM revival firmware. However, the inventive concepts are not limited thereto, and the memory revival firmware FW stored in the VM 130 may include memory revival firmware applicable to various memories.

In some example embodiments, the memory revival firmware FW stored in the memory 111 may be identical to the memory revival firmware FW stored in the VM 130. For example, the memory revival firmware FW may be downloaded to the memory 111, and then may be migrated (e.g., transferred) from the memory 111 to the VM 130.

The storage device 100 (e.g., the memory controller 110) may perform a test on the defective memory based on executing the stored memory revival firmware FW. The storage device 100 (e.g., the memory controller 110) may, based on executing the memory revival firmware FW, identify the defective cells in the defective memory, analyze defective attributes of the defective cells, and perform the repair operation on the defective cells. The storage device 100 (e.g., the memory controller 110) may regenerate the defective memory by replacing the defective cell with a redundancy cell, as part of performing the repair operation, and accordingly, the defective memory may be reused based on the repair operation being performed. Thus, because the storage device 100 is not replaced, costs may be reduced.

Accordingly, it will be understood that the memory controller 110, in some example embodiments, is configured to, in response to a determination that a progressive defect has occurred in at least one memory of the NVM 120 or the VM 130 during an operation of the storage device 100, such that the at least one memory is determined to be a defective memory, perform a repair operation on the defective memory based on executing the memory revival firmware FW.

In some example embodiments, when the progressive defect occurs (e.g., in response to a determination that the progressive defect has occurred), the memory controller 110 may mark a memory fail signature and reset the storage device 100. In addition, in some example embodiments, when the repair operation is completed for the defective memory (e.g., in response to the repair operation performed on the defective memory being completed), the memory controller 110 may change the memory fail signature to a memory fixed signature and reset the storage device 100. This issue is described in more detail with reference to FIGS. 13 and 14.

The storage system 10 may be implemented with, for example, a personal computer (PC), a data server, a network-attached storage (NAS), an Internet of things (IoT) device, or a portable electronic device. The portable electronic device may include a laptop computer, a mobile phone, a smartphone, a tablet PC, a personal digital assistant (PDA), an enterprise digital assistant (EDA), a digital still camera, a digital video camera, an audio device, a portable multi-media player (PMP), a personal navigation device (PND), an MP3 player, a handheld game console, an e-book, a wearable device, and the like.

In some example embodiments, the storage device 100 may include an internal memory embedded in an electronic device. For example, the storage device 100 may include an embedded universal flash storage (UFS) memory device or an embedded multi-media card (eMMC). In some example embodiments, the storage device 100 may include an external memory removable from the electronic device. For example, the storage device 100 may include a universal flash storage (UFS) memory card, a compact flash (CF) memory card, a secure digital (SD) card, a micro-SD card, a mini SD card, an extreme digital (xD) card, or a memory stick.

In some example embodiments, the storage device 100 or a plurality of storage devices may be used in a data center. For example, the storage device 100 or the plurality of storage devices may be included in a storage server (for example, 1200 or 1200n in FIG. 15) or an application server (for example, 1100 or 1100n in FIG. 15) in the data center, and the storage system 10 may include the data center.

Recently, along with the growth of the data center, storage business related with the storage device 100, such as solid state drive SSD, is also expanding. Because security of the storage device 100 is very important due to the nature of the data center that needs to manage the private data of customers, when a defect occurs in the storage device 100, it may be difficult to take out the storage device 100 for accurate failure analysis. In addition, as the possibility increases that progressive defects occur due to fragile progressive defects according to a semiconductor micro-process, the storage device 100 or the storage system 10 using memories such as the NVM 120, the VM 130, and the memory 111 may be also vulnerable to the progressive defects.

Furthermore, as the performance of the electronic devices such as a central processing unit (CPU), a memory, and a storage device is rapidly increasing every year, a system architecture and communication protocol may also require a high-speed operation to take full advantage of the performance of the electronic devices. The performance of the electronic devices increases due to an increase in an input/output (I/O) speed according to requirements. However, to the contrary, a thermal issue may occur due to more power consumption, and may affect the reliability of the memory devices, such as the NVM 120, the VM 130, and the memory 111, and thus, it may be highly likely that the progressive defects due to the fragile process are accelerated.

Figure 2:
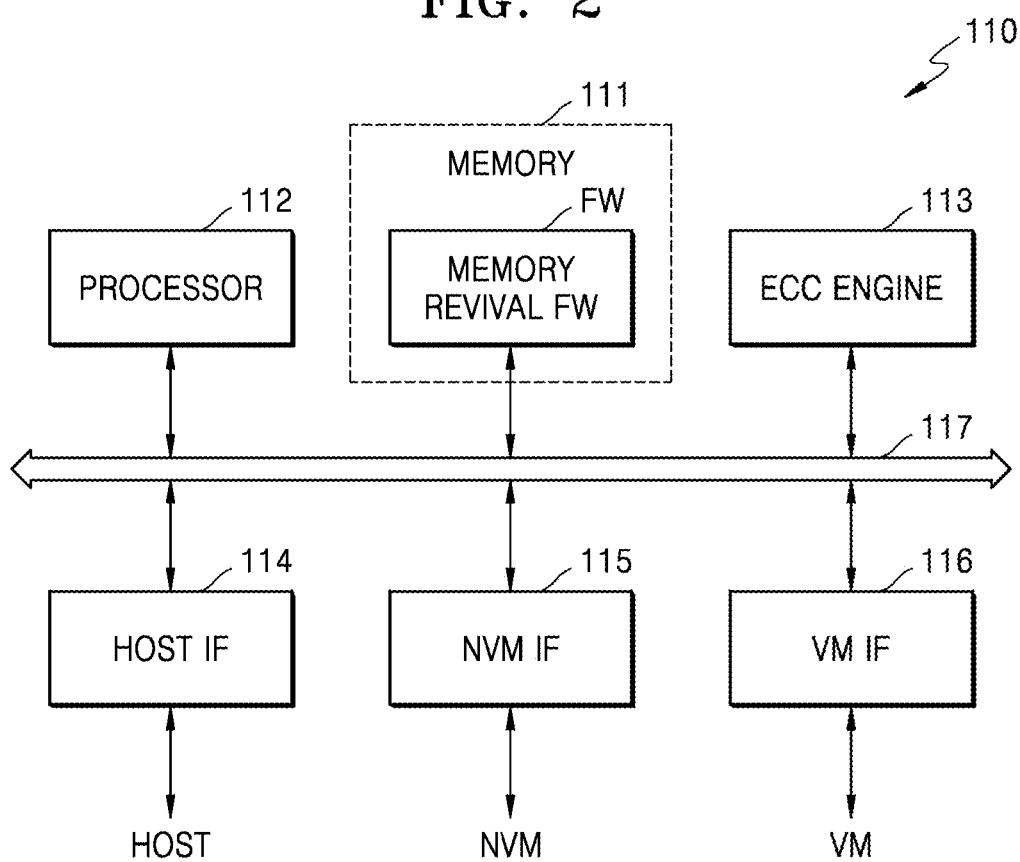
FIG. 2 is a block diagram illustrating a memory controller according to some example embodiments.

FIG. 2 is a block diagram illustrating the memory controller 110 according to some example embodiments.

Referring to FIGS. 1 and 2 together, the memory controller 110 may include the memory 111, a processor 112, an error checking and correcting (ECC) engine 113, a host interface (IF) 114, an NVM IF 115, and a VM IF 116, which are capable of communicating with each other via a bus 117. The processor 112 may include a CPU, a microprocessor, or the like, and may control the overall operation of the memory controller 110.

The memory 111, also referred to herein as an internal memory of the memory controller 110, may operate under control of the processor 112, and may be used as an operation memory, a buffer memory, a cache memory, or the like. For example, the memory 111 may be implemented as a VM such as DRAM and SRAM, or an NVM such as PRAM and a flash memory. In some example embodiments, the memory 111 may include a VM, and some example embodiments in which the memory 111 is implemented with SRAM is mainly described. The memory revival firmware FW may be loaded in the memory 111, and the processor 112 may access the memory 111 and execute the memory revival firmware FW. However, the inventive concepts are not limited thereto, and the memory revival firmware FW may be implemented with hardware. In some example embodiments, the memory 111 may include static RAM (SRAM), and the storage device 100 (e.g., the memory controller 110) may be configured to, in response to a determination that a progressive defect has occurred in the SRAM (e.g., memory 111) perform a repair operation on the SRAM based on executing at least a portion of the memory revival firmware FW.

The ECC engine 113 may detect an error bit in the data and correct the detected error bit by performing an ECC operation on the data received from the NVM 120 via the NVM IF 115. Accordingly, the ECC engine 113 may be configured to correct an error of data read from a memory (e.g., NVM 120, memory 111, and/or VM 130). In addition, the ECC engine 113 may detect the error bit in the data and correct the detected error bit based on performing an ECC operation on the data received from the VM 130 via the VM IF 116. In some example embodiments, the ECC engine 113 may be implemented with hardware. In some example embodiments, the ECC engine 113 may be implemented with software or firmware, and may be loaded into the memory 111.

The host IF 114 may provide an interface between the host 200 and the memory controller 110 (e.g., the host IF 114 may be configured to communicate with the host 200), and may provide an interface according to, for example, universal serial bus (USB), multimedia card (MMC), peripheral component interconnect (PCI) express (PCIe), advanced technology (AT) attachment (ATA), serial ATA (SATA), parallel ATA (PATA), small computer system interface (SCSI), serial attached SCSI (SAS), enhanced small disk interface (ESDI), integrated drive electronics (IDE), or the like.

The NVM IF 115 may provide an interface between the memory controller 110 and the NVM 120 (e.g., the NVM IF 115 may be configured to communicate with the NVM 120). For example, the memory revival firmware FW may be transceived between the memory controller 110 and the NVM 120 via the NVM IF 115. In addition, for example, mapping tables, write data, and read data may be transceived between the memory controller 110 and the NVM 120 via the NVM IF 115. For example, the memory revival firmware FW may be configured to be downloaded by the memory controller 110 from the NVM 120 via the NVM IF 115.

The VM IF 116 may provide an interface between the memory controller 110 and the VM 130 (e.g., the VM IF 116 may be configured to communicate with the VM 130). For example, the memory revival firmware FW may be transceived between the memory controller 110 and the VM 130 via the VM IF 116. In addition, for example, write data received from the host 200 may be buffered in the VM 130 via the VM IF 116, and read data received from the NVM 120 may be buffered in the VM 130 via the VM IF 116.

Either or both of the NVM IF 115 or the VM IF 116 may be referred to herein as a "memory interface" of the memory controller 110 that is configured to transceive data with a memory (e.g., NVM 120 and/or VM 130).

Figure 3:
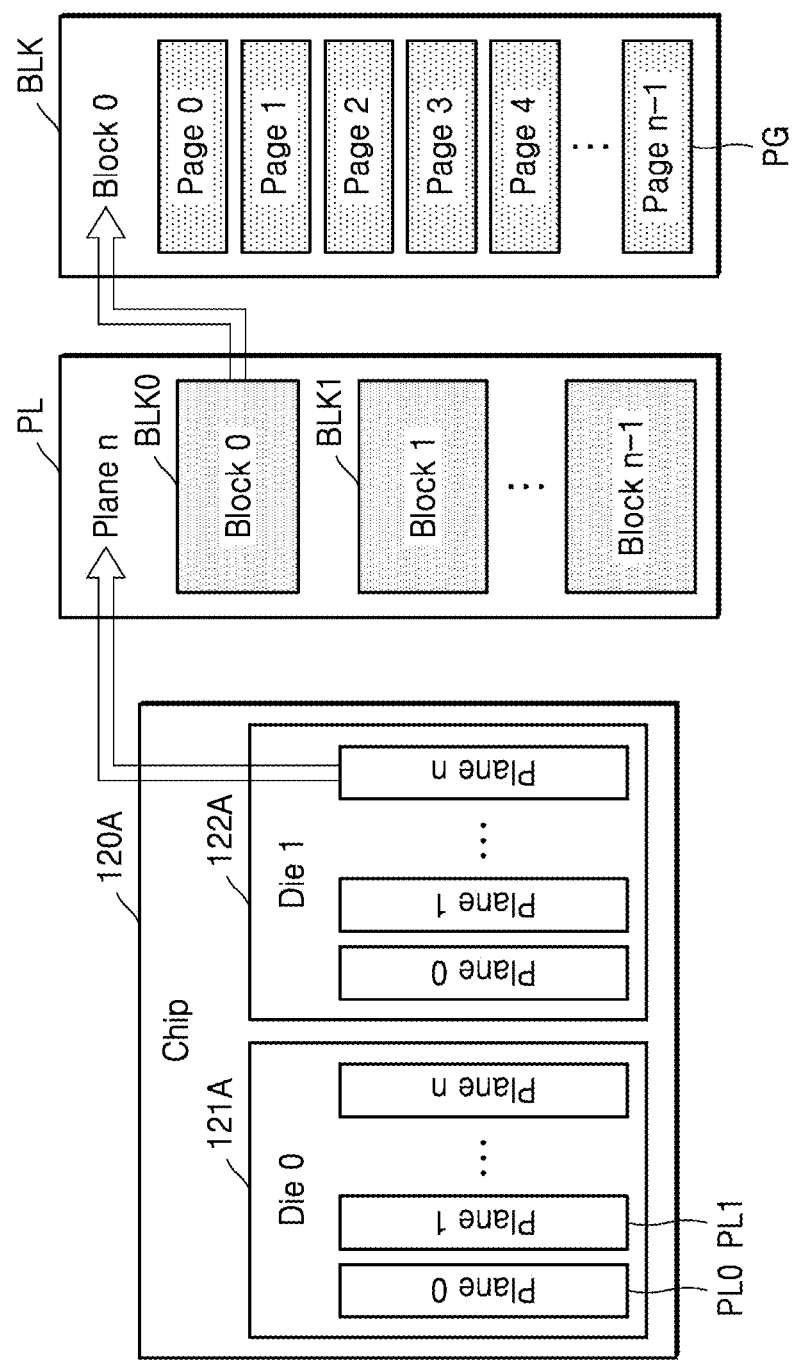
FIG. 3 is a block diagram illustrating a non-volatile memory according to some example embodiments.

FIG. 3 illustrates an NVM 120A according to some example embodiments.

Referring to FIG. 3, the NVM 120A may include a NAND flash memory, and may be implemented in a single chip. The NVM 120A may include a first die 121A and a second die 122A, and each of the first and second dies 121A and 122A may include a plurality of planes PL0 and PL1, respectively. Each plane PL may include a plurality of memory blocks BLK0 and BLK1, and each memory block BLK may include a plurality of pages PG.

For example, when a defective page PG occurs (e.g., in response to a defective page PG occurring), the defective page may be replaced with a reserved page based on the storage device (e.g., memory controller 110) executing the memory revival firmware FW, and accordingly, the defective memory may be reused. For example, when a defective block occurs (e.g., in response to the defective block occurring), the defective block may be replaced with a reserved block based on the storage device (e.g., memory controller 110) executing the memory revival firmware FW, and accordingly, the defective memory may be reused. For example, when a defective plane occurs (e.g., in response to a defective plane occurring), the defective plane may be replaced with a reserved plane based on the storage device (e.g., memory controller 110) executing the memory revival firmware FW, and accordingly, the defective memory may be reused. For example, when a defective die occurs (e.g., in response to a defective die occurring), the defective die may be replaced with a reserved die based on the storage device (e.g., memory controller 110) executing the memory revival firmware FW, and accordingly, the defective memory may be reused.

Figure 4A:
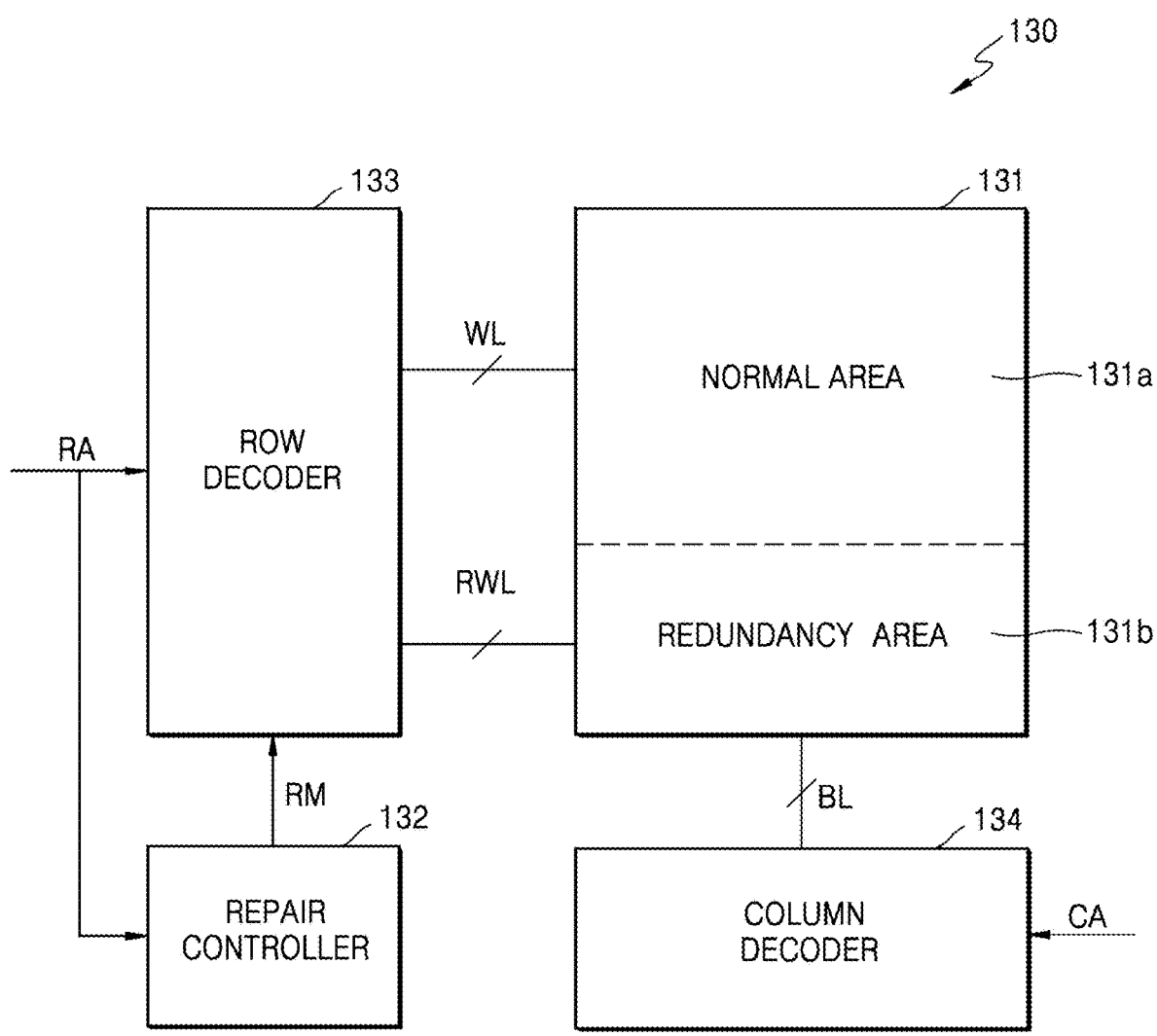
FIGS. 4A and 4B illustrate volatile memories according to some example embodiments.

FIG. 4A illustrates the VM 130 according to some example embodiments.

Referring to FIG. 4A, the VM 130 may include an MCA 131, a repair controller 132, a row decoder 133, and a column decoder 134. However, the configuration of the VM 130 is not limited thereto, and the VM 130 may further include a page buffer temporarily storing data to be stored in the MCA 131 or temporarily storing data read from the MCA 131, a data I/O circuit transceiving the data stored in the page buffer to the outside, or a controller receiving a command from the outside and controlling the overall operation of the VM 130 according to the command.

The MCA 131 may include a normal area 131a in which a plurality of memory cells are arranged, and a redundancy area 131b in which a plurality of redundancy memory cells are arranged. In some example embodiments, the redundancy area 131b may be arranged adjacent to the normal area 131a according to an extending direction of bit lines BL. The normal area 131a may include a plurality of memory cells that are respectively arranged in crossing areas of a plurality of word lines WL and the plurality of bit lines BL, and the redundancy area 131b may include a plurality of redundancy memory cells that are respectively arranged in the crossing areas of a plurality of redundancy word lines RWL and the plurality of bit lines BL.

A defect may occur in at least one of the memory cells in the normal area 131a, and a cell in which the defect has occurred may be referred to as a single bit, a weak cell, or a defective cell. The defective cell that occurred in the normal area 131a may be replaced with a redundancy memory cell included in the redundancy area 131b, and this operation may be referred to as a "repair operation". By the repair operation, data to be written to or read from the defective cell may be written to or read from the redundancy memory cell. Accordingly, it will be understood that the storage device 100 (e.g., the memory controller 110) may be configured to perform the repair operation, based on executing memory revival firmware FW, by replacing at least one defective cell (for example a defective cell among the cells in normal area 131a) among a plurality of memory cells in the defective memory (e.g., the at least one of the NVM 120, VM 130, or memory 111 in which the progressive defect has occurred) with a redundancy memory cell, also referred to herein as a "redundancy cell" (e.g., a cell among the cells in redundancy area 131b).

In some example embodiments, the repair operation may be performed according to a row repair method that replaces a row including the defective cell in the normal area 131a with a redundancy row in the redundancy area 131b. In some example embodiments, a repair unit may be the word line WL, and accordingly, the word line WL including the defective cell may be replaced with the redundancy word line RWL. In some example embodiments, the repair unit may be a word line group, and accordingly, the word line group including the defective cell may be replaced with a redundancy word line group. For example, the word line group may correspond to 2, 4, 8, 16, or the like word lines. When the repair unit is two word lines WL, the two word lines WL including the defective cell included in the normal area 131a may be replaced with the two redundancy word lines RWL included in the redundancy area 131b.

The repair controller 132 may control the repair operation on the defective cell among the plurality of memory cells, according to the memory revival firmware FW. The repair controller 132 may control the repair operation when an input address of the memory cell to be accessed, for example, a row address RA, corresponds to the defective cell. The repair controller 132 may generate a row matching signal RM when the row address RA corresponds to the defective cell and may provide the generated row matching signal RM to the row decoder 133. Accordingly, the row decoder 133 may activate the redundancy word lines RWL in response to the row matching signal RM.

The row decoder 133 may select some word lines WL among the plurality of word lines WL in response to the row address RA and activate the selected word lines WL. In addition, the row decoder 133 may select some redundancy word lines RWL among the plurality of redundancy word lines RWL in response to the row matching signal RM and may activate the selected redundancy word line RWL. The row decoder 133 may disable the row address RA, in response to the row matching signal RM, and activate the redundancy word line RWL. The column decoder 134 may select some bit lines BL among the plurality of bit lines BL in response to the column address CA.

Figure 4B:
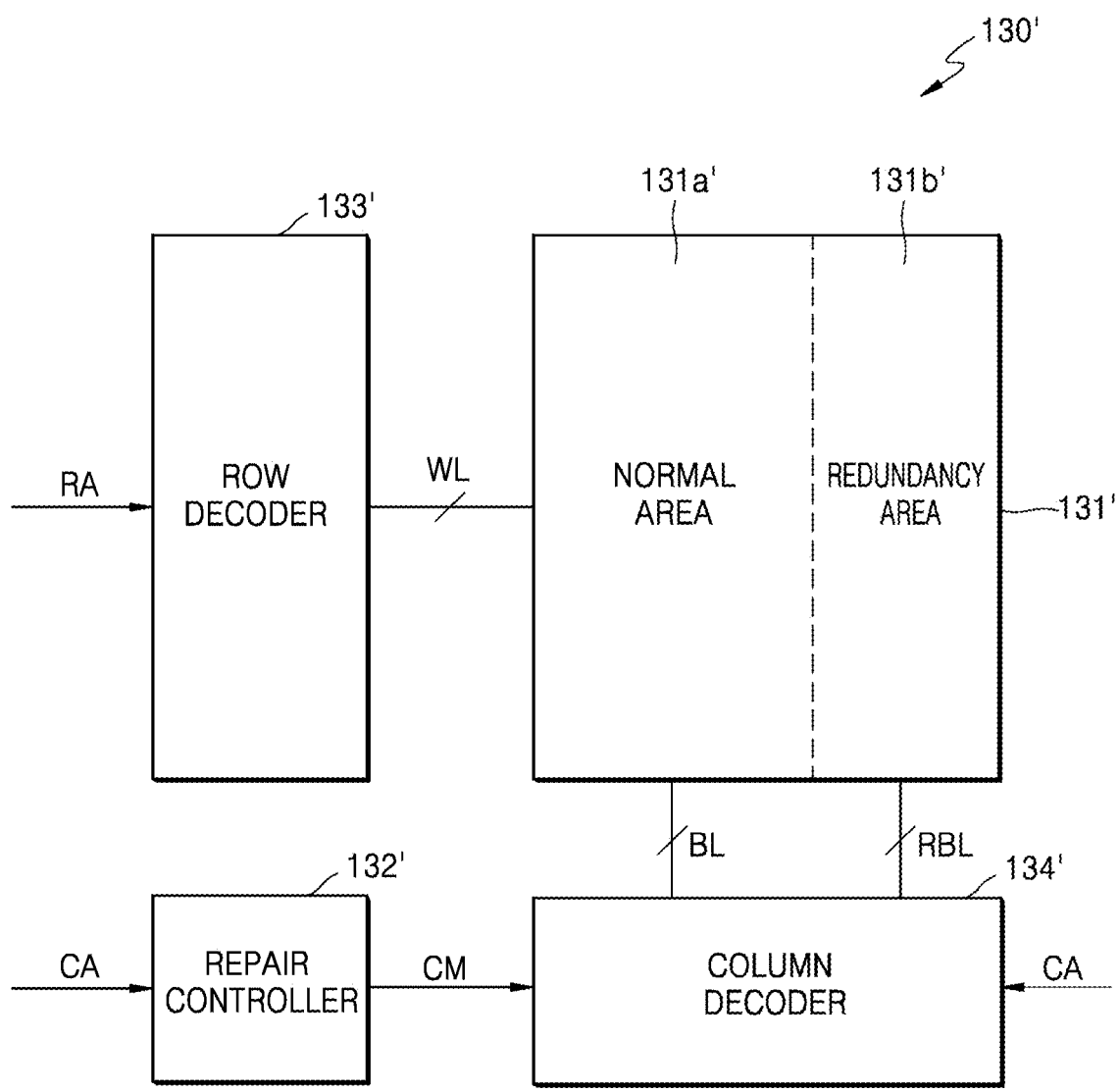

FIG. 4B illustrates a VM 130' according to some example embodiments.

Referring to FIG. 4B, the VM 130' may include an MCA 131', a repair controller 132', a row decoder 133', and a column decoder 134'. The VM 130' according to some example embodiments may be a modified example embodiment of the VM 130 of FIG. 4A, and duplicate descriptions previously given are omitted.

The MCA 131' may include a normal area 131a', in which a plurality of memory cells are arranged, and a redundancy area 131b', in which a plurality of redundancy memory cells are arranged. In some example embodiments, the redundancy area 131b' may be arranged adjacent to the normal area 131a' according to an extending direction of the word lines WL. The normal area 131a' may include a plurality of memory cells that are respectively arranged in crossing areas of a plurality of word lines WL and the plurality of bit lines BL, and the redundancy area 131b' may include a plurality of redundancy memory cells that are respectively arranged in the crossing areas of the plurality of word lines WL and the plurality of redundancy bit lines RBL.

A defect may occur in at least one of the memory cells in the normal area 131a', and a defective cell that occurred in the normal area 131a' may be replaced by the redundancy memory cell included in the redundancy area 131b' by the repair operation. By the repair operation, data to be written to or read from the defective cell may be written to or read from the redundancy memory cell.

In some example embodiments, the repair operation may be performed according to a column repair method that replaces a column including the defective cell in the normal area 131a' with a redundancy column in the redundancy area 131b'. In some example embodiments, a repair unit may be the bit line BL, and accordingly, the bit line BL including the defective cell may be replaced with the redundancy bit line RBL. In some example embodiments, the repair unit may be a bit line group, and accordingly, the bit line group including the defective cell may be replaced with a redundancy bit line group. For example, the bit line group may correspond to 2, 4, 8, 16, or the like bit lines. When the repair unit is two bit lines BL, the two bit lines BL including the defective cell included in the normal area 131a' may be replaced with the two redundancy bit lines RBL included in the redundancy area 131b'.

The repair controller 132' may control the repair operation on a defective cell among a plurality of memory cells. The repair controller 132' may control the repair operation when an input address of the memory cell to be accessed, for example, a column address CA, corresponds to the defective cell (e.g., in response to a determination that the input address corresponds to the defective cell). The repair controller 132' may generate a column matching signal CM when the column address CA corresponds to the defective cell and may provide the generated column matching signal CM to the column decoder 134'. Accordingly, the column decoder 134' may activate the redundancy bit lines RBL in response to the column matching signal CM.

The row decoder 133' may, in response to the row address RA, select some word lines WL among the plurality of word lines WL, and activate the selected word lines WL. The column decoder 134' may, in response to the column address CA, select some bit lines BL among the plurality of bit lines BL, and activate the selected bit lines BL. In addition, the column decoder 134' may, in response to the column matching signal CM, select some redundancy bit lines RBL among the plurality of redundancy bit lines RBL, and activate the selected redundancy bit lines RBL. The column decoder 134' may, in response to the column matching signal CM, disable the column address CA and activate the redundancy bit line RBL.

Figure 5:
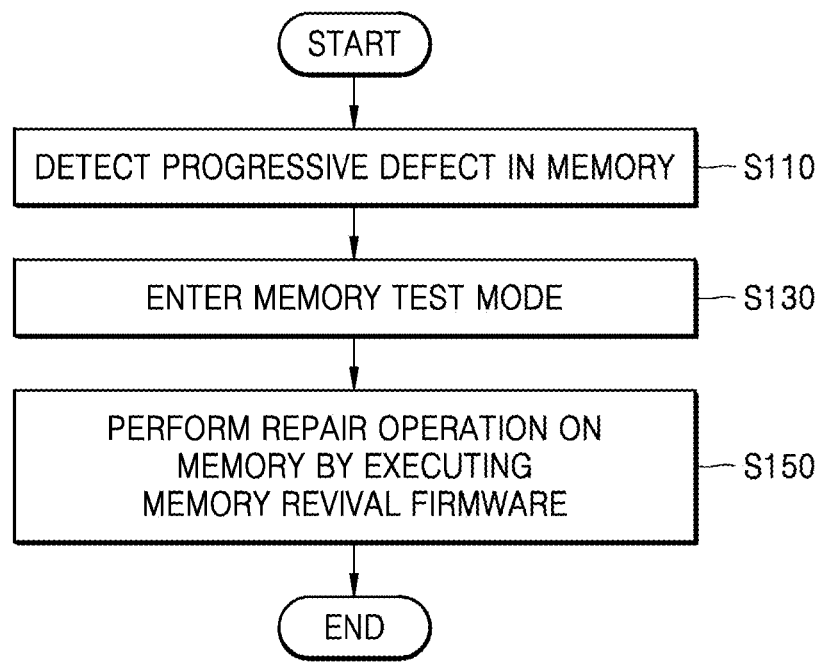
FIG. 5 is a flowchart of an operating method of a storage device, according to some example embodiments.

FIG. 5 is a flowchart of an operating method of a storage device, according to some example embodiments. Said method may be implemented by any portion of a storage device according to any example embodiments herein, including the memory controller 110 of the storage device 100 shown in FIG. 1. Operations described herein as being performed by the storage device 100 may be performed by any part of the storage device 100, including the memory controller 110.

Referring to FIG. 5, the operating method of a storage device according to some example embodiments may be performed during the operation of a storage device after shipment of a storage device such as a disk, that is, an SSD. For example, the operating method of the storage device according to some example embodiments may include a plurality of operations performed in a time series in the storage device 100 in FIG. 1. Hereinafter, descriptions are given with reference to FIGS. 1, 2, and 5.

The storage device 100 (e.g., the memory controller 110) may detect the progressive defect of the memory, which may be at least one of the NVM 120, the VM 130, or the memory 111 (S110). Restated, the storage device 100 (e.g., the memory controller 110) may determine that a progressive defect has occurred in at least one memory of the NVM 120, the VM 130, or the memory 111, such that the at least one memory is determined to be a defective memory. For example, the memory controller 110 may detect the UECC in the NVM 120, the VM 130, or the memory 111. For example, by performing the ECC operation on data received from the NVM 120, the VM 130, or the memory 111, the ECC engine 113 may detect an error bit of the data and correct the detected error bit. In some example embodiments, when an uncorrected error bit occurs in the ECC engine 113 (e.g., in response to said occurrence), the memory controller 110 may detect the progressive defect of the memory by determining that the uncorrected error bit is an unrecoverable error. Restated, the memory controller 110 may determine that the progressive defect has occurred in a memory based on a determination, by the memory controller 110, that an uncorrectable error has occurred in the memory, where the uncorrectable error is an error that the ECC engine 113 is not capable of correcting.

As described herein, it will be understood that "detecting" or "detection of" an occurrence, event, state of one or more elements, or the like, may be interchangeably referred to as "determining" or a "determination that" said occurrence, event, state of one or more elements, or the like has occurred. For example, as described herein, detecting a progressive defect may be interchangeably referred to as a "determination" that the progressive defect has occurred.

The storage device 100 (e.g., the memory controller 110) may enter a memory test mode (S130). The storage device 100 may enter the memory test mode in response to the detection of the progressive defect at S110. In some example embodiments, the memory test mode may correspond to a firmware downloadable mode, and the memory controller 110 may enter the memory test mode or the firmware downloadable mode to download the memory revival firmware FW from the host 200, and this is described later with reference to FIG. 6. In some example embodiments, the memory test mode may correspond to the firmware downloadable mode, and the memory controller 110 may receive (e.g., download) the memory revival firmware FW from the NVM 120. This is described later with reference to FIGS. 11 through 13.

The storage device 100 (e.g., the memory controller 110) may perform the repair operation on the memory in which the progressive defect is determined to have occurred (e.g., the defective memory) based on executing the memory revival firmware FW (S150). The storage device 100 may perform the repair operation in response to the detection of the progressive defect at S110, the entering of the memory test mode at S130, and/or the receipt (e.g., downloading) of the memory revival firmware FW. For example, the storage device 100 (e.g., the memory controller 110) may, in response to a determination at S110 that a progressive defect has occurred in at least one memory of the NVM 120, the VM 130, or the memory 111, such that the at least one memory is determined to be a defective memory, perform a repair operation on the defective memory based on executing the memory revival firmware FW. For example, the memory controller 110 may regenerate the NVM 120, the VM 130, or the memory 111 based on executing the memory revival firmware FW. The memory controller 110 may be in the memory test mode, entered at S130, when performing the repair operation at S150, such that performing the repair operation at S150 includes executing the memory revival firmware FW in the memory test mode. The memory controller 110 may perform a test on the NVM 120, the VM 130, or the memory 111, analyze the defective attributes, and repair the defective cell. Such performing at S150 may be performed in response to S110, independently of S130 being performed.

In some example embodiments, the operation method described above may further include, when the progressive defect is detected (e.g., in response to a determination that the progressive defect has occurred), an operation in which the memory controller 110 marks a memory fail signature and resets the storage device 100. In addition, in some example embodiments, the operation method described above may further include, when the repair operation is completed (e.g., in response to a determination that the repair operation on the defective memory is completed), an operation in which the memory controller 110 corrects the memory fail signature as the memory repair signature (e.g., changes the memory fail signature to a memory fixed signature), and resets the storage device 100. This is described in more detail with reference to FIGS. 13 and 14.

As described above, according to some example embodiments, when a defect occurs (e.g., in response to a defect occurring) in a disk being used in a data center or a server system, that is, in the storage device 100, the storage device 100 may be regenerated based on performing a test and repairing the memory. When the storage device 100 identifies the UECC of the memory (e.g., in response to the storage device 100 identifying the UECC of the memory), the storage device 100 may not enter a defect mode but may enter a memory test mode in which the memory revival firmware FW may be received (e.g., downloaded).

The host 200, that is, a data center host, may transfer the memory revival firmware FW to the storage device 100 to test the memory. Said transfer may include the storage device 100 (e.g., memory controller 110) downloading the memory revival firmware FW from the host 200. Said transfer of the memory revival firmware FW to the storage device 100 may be performed in response to the host 200 receiving information about the progressive defect from the storage device 100, for example based on processing the information to determine a particular memory revival firmware FW associated with the defect (e.g., a particular memory revival firmware FW corresponding to a particular type or attribute of the memory in which the progressive defect has occurred (i.e., the defective memory), selecting the particular memory revival firmware FW, and transferring the selected memory revival firmware FW to the storage device 100 and/or enabling the storage device 100 to download the selected memory revival firmware FW from the host 200. In some example embodiments, the host 200 may store a database of various separate pieces of memory revival firmware FW that correspond to different types or attributes of one or more memories. The host 200 may maintain a look-up table or other database storing relationships (e.g., empirically-determined relationships) between particular types or attributes of defective memories and corresponding particular pieces of memory revival firmware FW. The host 200 may process received information about a progressive defect, where the information includes information associated with a particular type or attribute of a memory in which the defective defect has occurred (e.g., the defective memory), to determine said particular type or attribute, access the look-up table or other database to determine or select a corresponding particular memory revival firmware FW from a plurality of memory revival firmwares FW, and provide the corresponding particular memory revival firmware FW to the storage device 100 (e.g., memory controller 110), which may include transferring the particular memory revival firmware FW and/or enabling the storage device 100 to download the particular memory revival firmware FW from the host 200, in response to the determination or selection of the corresponding memory revival firmware FW. After performing the memory test, the memory revival firmware FW may identify the defective cell, analyze the attributes, perform the repair, and return a test result together with an attribute defect analysis log to the host 200. In this manner, by repairing the defective memory, the defective disk may be used as a normal disk. Thus, the data center may reduce bad disks, and a disk manufacturer may perform an in-house level defect analysis in a customer environment.

Figure 6:
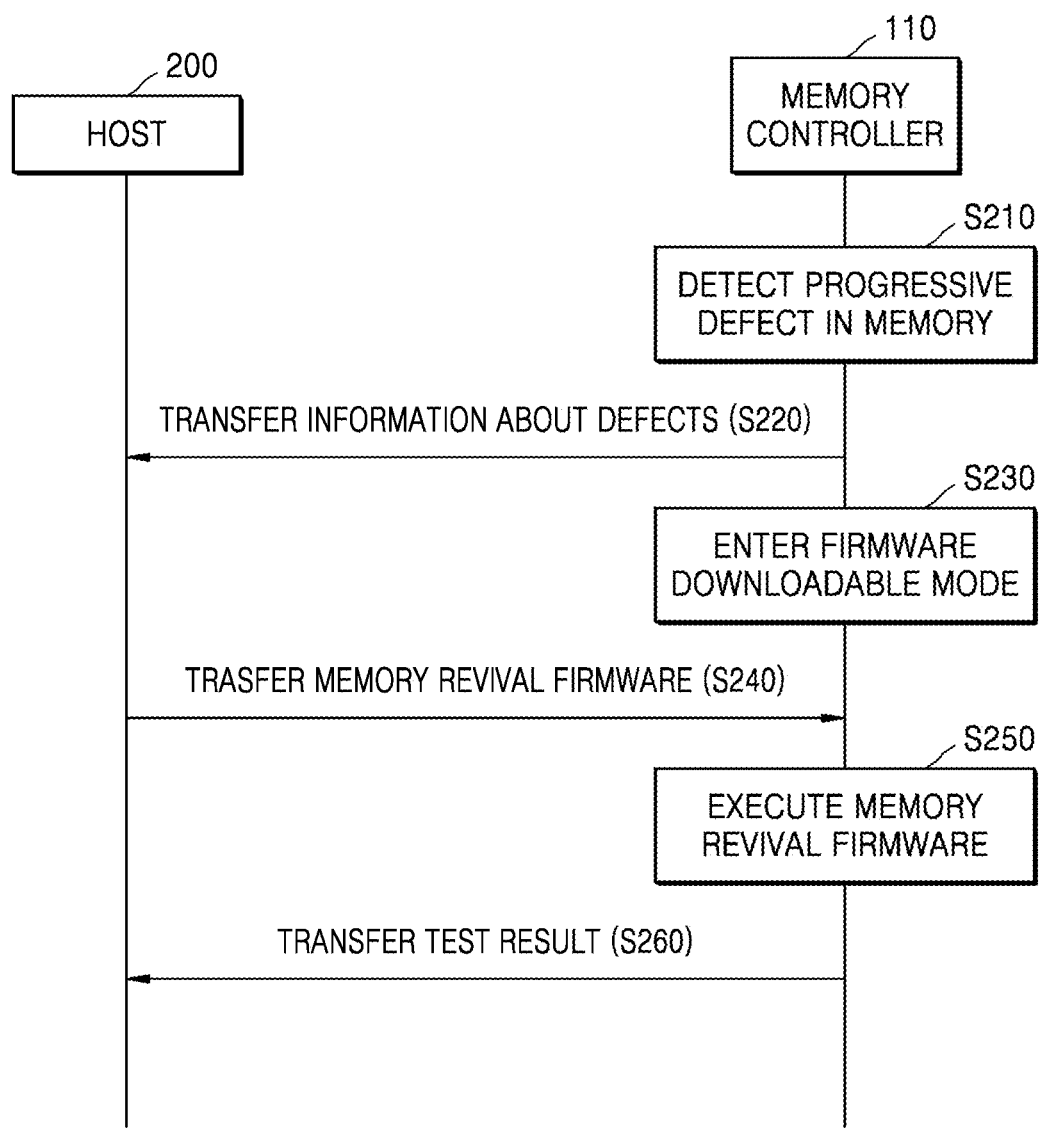
FIG. 6 is a flowchart illustrating an operation between a host and a memory controller, according to some example embodiments.

FIG. 6 is a flowchart illustrating an operation between the host 200 and the memory controller 110, according to some example embodiments.

Referring to FIG. 6, the memory controller 110 may detect a progressive defect in the memory (S210) (e.g., determine that the progressive defect has occurred in the memory, such that the memory is determined to be a defective memory). In response, the memory controller 110 may transfer the information about (e.g., associated with) the progressive defect, which may include information associated with a particular type or attribute of the defective memory in which the progressive defect has occurred, to the host 200 (S220), for example in response to the detection of the progressive defect at S210. The memory controller 110 may then, in response to S210 and/or S220 being performed, enter the firmware downloadable mode (S230) such that the memory controller 110 is operating in a firmware downloadable mode. According to some example embodiments, a sequence of operations S220 and S230 may be changed. In some example embodiments, operations S220 and S230 may be performed substantially simultaneously.

The host 200 may transfer the memory revival firmware FW to the memory controller 110 (S240), for example in response to receiving the transferred information at S220. Accordingly, at S240, the memory controller 110 may receive (e.g., download) the memory revival firmware FW from the host 200 in a firmware downloadable mode, where the memory revival firmware FW is received (e.g., downloaded) by the memory controller 110 at S240 (e.g., concurrently with the memory controller 110 operating in a firmware downloadable mode that was entered at S230) based on the information associated with the progressive defect having been transferred to the host at S220. The receipt at S240 may be based on the host 200 receiving the information at S220 and processing the information. The host 200 may process the information received at S220 to determine a particular type or attribute of the memory in which the progressive defect has occurred and may, in response, determine or select and then transfer, at S240, a particular memory revival firmware FW corresponding to the particular type or attribute of the memory in which the progressive defect has occurred, where the particular corresponding memory revival firmware FW may be determined or selected by the host 200 based on accessing a look-up table or database that relates types or attributes of memory in which a progressive defect may have occurred with corresponding pieces of memory revival firmware FW. The memory controller 110 may execute the memory revival firmware FW (e.g., memory revival firmware FW downloaded from the host at S240) for the memory repair (S250), for example in response to receiving (e.g., downloading) the memory revival firmware FW at S240. Such execution may include downloading the received memory revival firmware FW, for example to memory 111. For example, the memory controller 110 may repair the defective memory based on executing the memory revival firmware FW downloaded to the memory 111. A test result may be generated based on execution of the memory revival firmware FW.

The memory controller 110 may transfer a test result to the host 200 (S260), for example in response to executing the memory revival firmware FW at S250. For example, the memory controller 110 may obtain the test result of executing the memory revival firmware FW and a result of analyzing the attributes of the defective cell, and at this time, the obtained results may correspond to the test result log. The memory controller 110 may provide the test result log to the host 200 as part of transferring the test result at S260. After operation S260 (e.g., in response to the repair program being performed based on execution of the memory revival firmware FW at S250), the storage device 100 may be formatted to reuse the defective memory.

Figure 7:
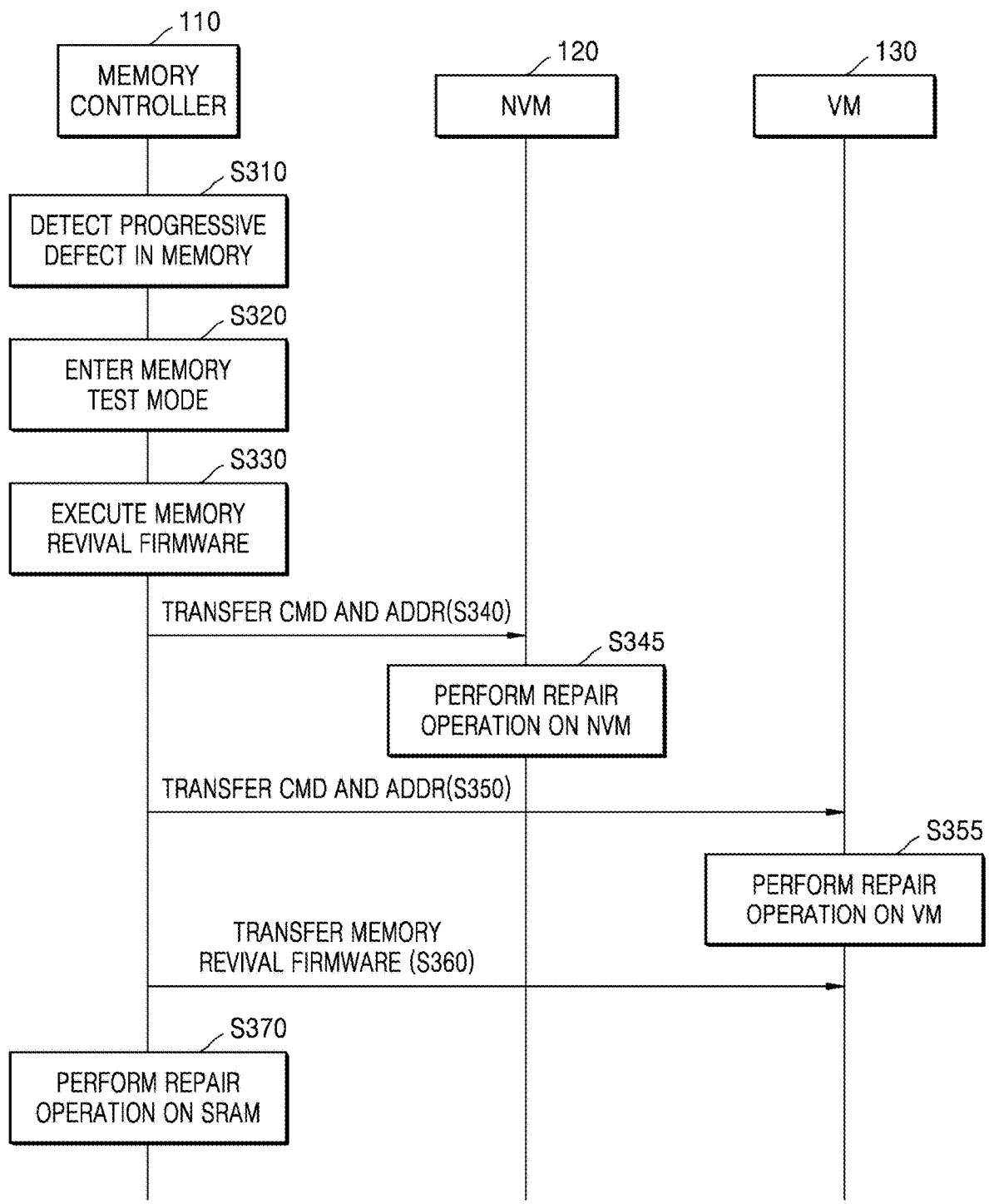
FIG. 7 is a flowchart illustrating an operation between a memory controller, a non-volatile memory, and a volatile memory, according to some example embodiments.

FIG. 7 is a flowchart illustrating an operation between the memory controller 110, the NVM 120, and the VM 130, according to some example embodiments.

Referring to FIG. 7, the memory controller 110 may detect a progressive defect in the memory, such that the memory is determined to be a defective memory (S310). For example, the memory controller 110 may detect the UECC in the NVM 120, the VM 130, or the memory 111. The memory controller 110 may, in response to the detection at S310, enter the memory test mode (S320). The memory controller 110 may, in response to the detecting at S310 and/or entering the memory test mode at S320, execute the memory revival firmware FW for the memory repair (S330).

The memory controller 110 may transfer a command CMD and an address ADDR for the memory repair to the NVM 120 (S340), for example in response to executing the memory revival firmware FW at S330. The NVM 120 may perform the NVM repair operation (S345), for example in response to receiving the command CMD and address ADDR for the memory repair at S340. The memory controller 110 may transfer the command CMD and the address ADDR for the memory repair to the VM 130 (S350), for example in response to executing the memory revival firmware FW at S330. The VM 130 may perform the VM repair operation (S355) for example in response to receiving the command CMD and address ADDR for the memory repair at S350. In some example embodiments, operations S350 and S355 may be performed ahead of operations S340 and S345. In some example embodiments, a sequence of operations S340 and S350 may be changed, and operations S345 and S355 may be performed substantially simultaneously. In some example embodiments, operations S340 and S345 or operations S350 and S355 may be omitted depending on the type of the defective memory.

The memory controller 110 may migrate the memory revival firmware FW stored in the memory 111 to the VM 130 (S360). The memory controller 110 may access the VM 130 to perform an SRAM repair operation (S370), for example in response to migrating the memory revival firmware FW to the VM 130 at S360. In some example embodiments, operations S360 and S370 may be omitted depending on the type of the defective memory. In some example embodiments, operations S360 and S370 may be performed ahead of operations S340 through S345. In some example embodiments, operations S345, S355, and S370 may be performed substantially simultaneously.

Figure 8:
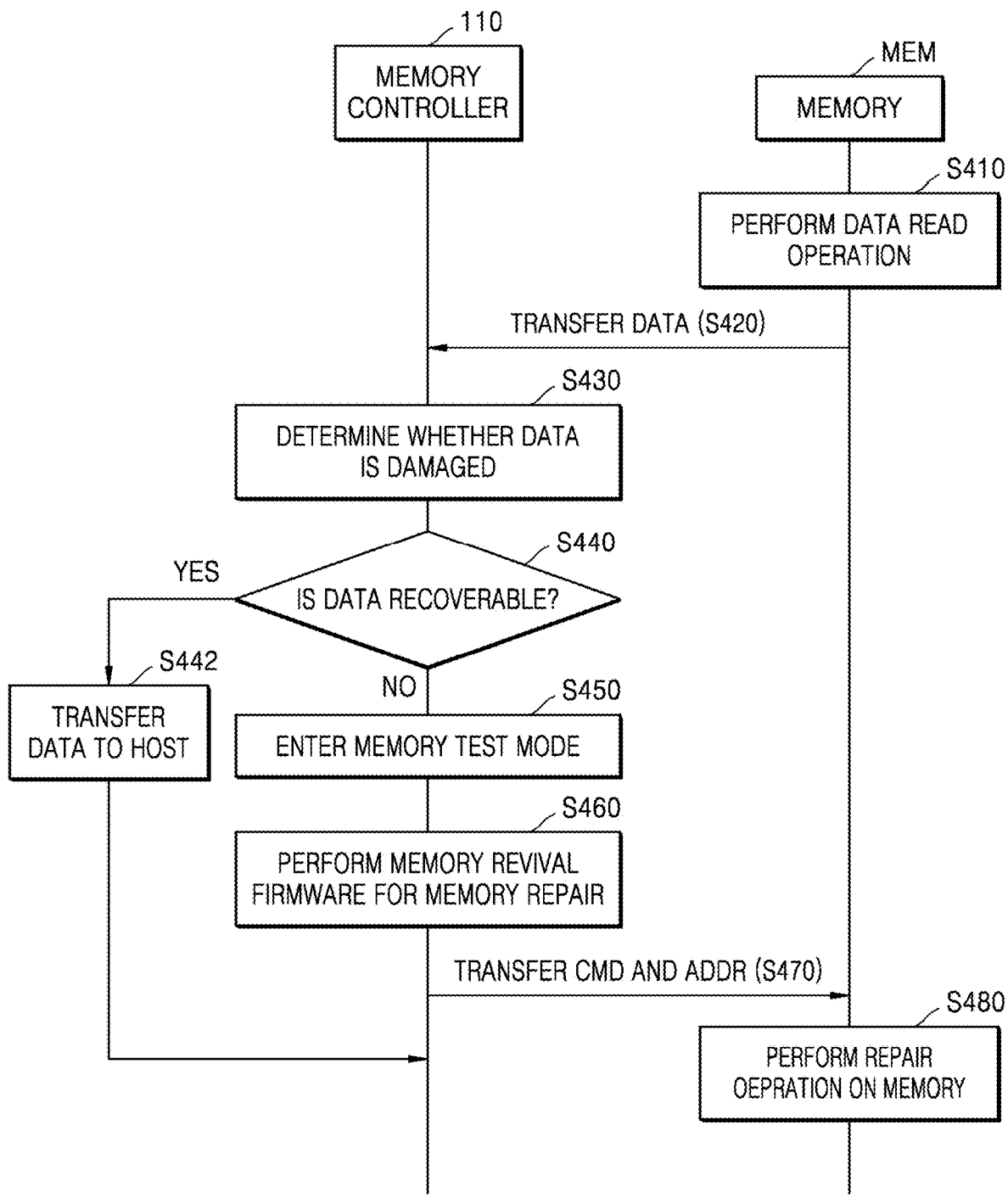
FIG. 8 is a flowchart illustrating an operation between a memory controller and a memory, according to some example embodiments.

FIG. 8 is a flowchart illustrating an operation between the memory controller 110 and a memory MEM, according to some example embodiments.

Referring to FIG. 8, the memory MEM may perform a data read operation (S410). The memory MEM may correspond to, for example, the NVM 120, the VM 130, or the memory 111 in FIG. 1. The memory MEM may transfer read data to the memory controller 110 (S420).

The memory controller 110 may determine whether the data is damaged (S430), for example in response to receiving the read data from the memory MEM at S420. The memory controller 110 may determine whether the data is recoverable (S440). As a result of the determination, when the data is recoverable (S440=YES), the memory controller 110 may, in response, transfer the read data to the host 200 (S442). On the other hand, when the data is irrecoverable (S440=NO), the memory controller 110 may, in response, enter the memory test mode. Descriptions on operations S430 and S440 are provided below with reference to FIG. 9.

The memory revival firmware FW may be executed for the memory repair (S460), for example in response to the memory controller 110 entering the memory test mode at S450. The memory controller 110 may transfer the command CMD and the address ADDR for the memory repair to the memory MEM (S470), for example in response to executing the memory revival firmware FW at S460. The memory MEM may perform the memory repair operation (S480), for example in response to receiving the command CMD and the address ADDR for the memory repair to the memory MEM at S470.

Figure 9:
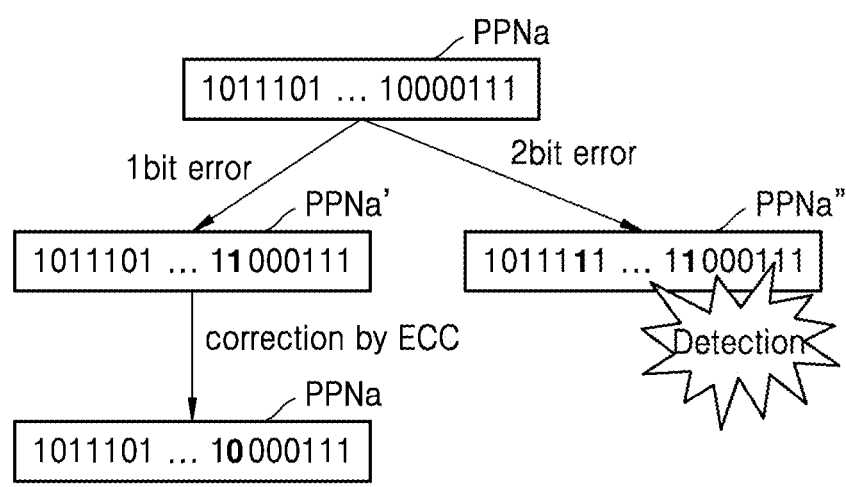
FIG. 9 illustrates an error correction code (ECC) operation according to the number of error bits in data, according to some example embodiments.

FIG. 9 illustrates the ECC operation according to the number (also referred to interchangeably herein as "quantity") of error-bits in data, according to some example embodiments.

Referring to FIGS. 2, 8, and 9 together, for example, an ECC allowable range of the ECC engine 113 may be one error-bit. For example, an occurrence of the one-bit error in a physical address PPNa may cause the physical address PPNa to be changed to a first damaged physical address PPNa'. In some example embodiments, because the number of error bits is one, the ECC engine 113 may correct the one-bit error, and accordingly, the first damaged physical address PPNa' may be corrected back to the normal physical address PPNa.

On the other hand, as another example, an occurrence of a two-bit error in the physical address PPNa may cause the physical address PPNa be changed to a second damaged physical address PPNa". In some example embodiments, because the number of error bits is two, the ECC engine 113 may not correct the two-bit error and may only detect the two-bit error. Accordingly, the second damaged physical address PPNa" may correspond to unrecoverable data.

Figure 10:
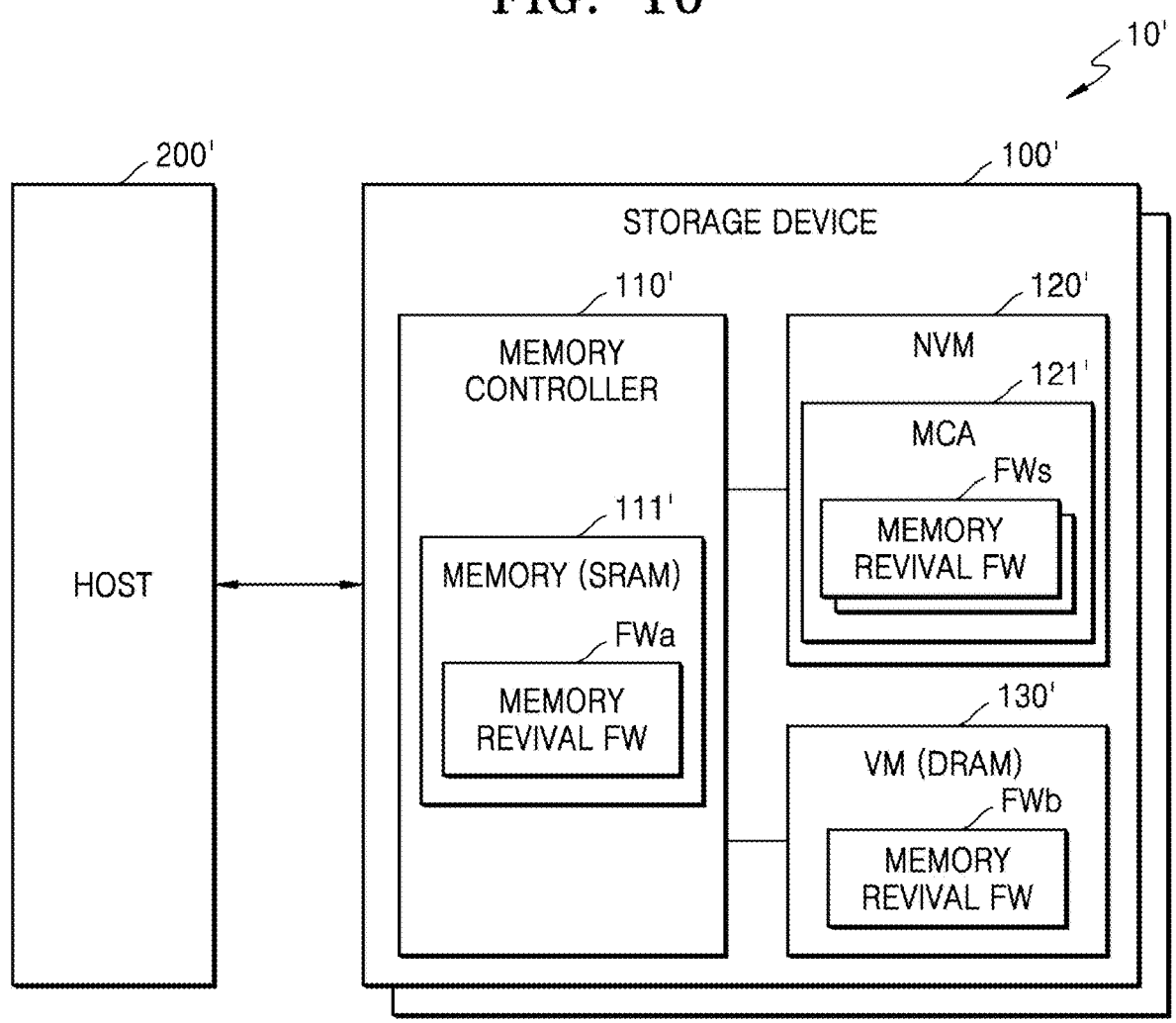
FIG. 10 is a block diagram illustrating a storage system according to some example embodiments.

FIG. 10 is a block diagram illustrating a storage system 10' according to some example embodiments.

Referring to FIG. 10, the storage system 10' may include a storage device 100' and a host 200', and the storage device 100' may include a memory controller 110' and an NVM 120'. In addition, the storage device 100' may further include a VM 130'. For example, the VM 130' may include DRAM. For example, the storage system 10' may include a plurality of storage devices 100'. The storage system 10' according to some example embodiments may correspond to a modified example of the storage system 10 of FIG. 1, and the descriptions given above with reference to FIGS. 1 and 2 may also be applied to some example embodiments.

According to some example embodiments, the storage device 100' may store a plurality of pieces of memory revival firmware FW in advance. For example, the plurality of pieces of memory revival firmware FW may be stored in the memory controller 110' or the NVM 120' before shipment of the storage device 100'. For example, the MCA 121' of the NVM 120' may store the plurality of pieces of memory revival firmware FW. Accordingly, when a defective memory occurs in the storage device 100' (e.g., in response to a determination that a defective memory has occurred in the storage device 100'), the storage device 100' may not receive memory revival firmware FW from the host 200', but may regenerate the defective memory based on executing one of the pieces of memory revival firmware FW previously stored therein. However, the inventive concepts are not limited thereto, and the storage device 100' may store one piece of memory revival firmware FW in advance.

The storage device 100' may enter the memory test mode when (e.g., in response to) detecting a defective memory. In some example embodiments, the memory test mode may be a mode in which memory revival firmware FWa or FWb that is loaded by loading the memory revival firmware FWa or FWb previously stored in the storage device 100' is executed. For example, when the storage device 100' detects an UECC (e.g., in response to the storage device 100' detecting the UECC), the memory in which the unrecoverable error has occurred may be determined (e.g., determined by the storage device 100') as a defective memory.

In some example embodiments, the storage device 100' may select particular memory revival firmware FWa or FWb among the plurality of pieces of pre-stored memory revival firmware FW based on the attribute or type of the defective memory, and may execute the selected particular memory revival firmware FWa or FWb. However, the inventive concepts are not limited thereto, and the storage device 100' may execute memory revival firmware FW applicable to all of various memories. For example, in some example embodiments, the memory revival firmware FW may include first memory revival firmware (e.g., FWa) that is applicable to NVM 120' (e.g., the first memory revival firmware may be configured to execute a repair operation on the NVM 120') and second memory revival firmware (e.g., FWb) that is applicable to VM 130' (e.g., the second memory revival firmware may be configured to execute a separate repair operation on the VM 130') and is different from FWa, such that the memory controller 110' may be configured to perform a repair operation based on executing the first memory revival firmware (e.g., FWa) in response to a determination that the progressive defect has occurred in the NVM 120', and the memory controller 110' may be configured to perform a repair operation based on executing the second memory revival firmware (e.g., FWb) in response to a determination that the progressive defect has occurred in the VM 130'. In some example embodiments, the first memory revival firmware (e.g., FWa) may be applicable to both the NVM 120' and the VM 130' (i.e., the first memory revival firmware may be configured to execute both a repair operation on the NVM 120' and a repair operation on the VM 130'), such that the memory controller 110' may be configured to perform the repair operation based on executing the first memory revival firmware (e.g., FWa) in response to a determination that the progressive defect has occurred in the VM 130'. In some example embodiments, the memory revival firmware FW may include third memory revival firmware (e.g., FWc) that is applicable to the memory 111', which may include static RAM (SRAM), and the memory controller 110' may be configured to, in response to a determination that a progressive defect has occurred in the SRAM (e.g., a separate progressive defect has occurred in the SRAM), perform a repair operation (e.g., a separate repair operation) on the SRAM based on executing the third memory revival firmware (e.g., FWc).

In some example embodiments, the storage device 100' may load the memory revival firmware FW in the memory 111'. For example, the memory revival firmware FW loaded in the memory 111' may include DRAM revival firmware or NVM revival firmware. However, the inventive concepts are not limited thereto, and the memory revival firmware FW loaded in the memory 111' may include memory revival firmware FW applicable to various memories.

In some example embodiments, the storage device 100' may load the memory revival firmware FWb in the VM 130'. For example, the memory revival firmware FWb loaded in the VM 130' may include SRAM revival firmware or NVM revival firmware. However, the inventive concepts are not limited thereto, and the memory revival firmware FWb loaded in the memory VM 130' may include memory revival firmware FW applicable to all of various memories.

The storage device 100' may perform a test on the defective memory based on executing the loaded memory revival firmware FWa or FWb. The storage device 100' may, based on executing the memory revival firmware FWa or FWb, identify the defective cells in the defective memory, analyze defective attributes, and perform the repair operation on the defective cells. The storage device 100' may regenerate the defective memory by replacing the defective cell with a redundancy cell, and accordingly, the defective memory may be reused. Thus, because the storage device 100' may not need to be replaced, costs may be reduced.

Figure 11:
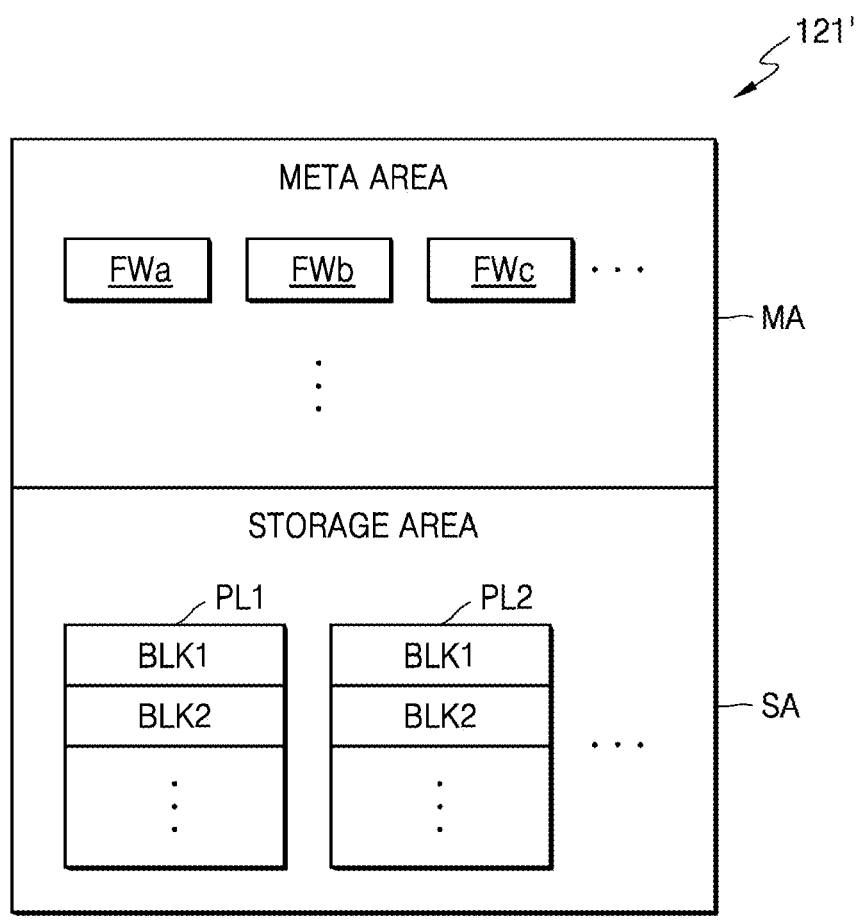
FIG. 11 illustrates a memory cell array included in a non-volatile memory in FIG. 10.

FIG. 11 illustrates an MCA 121' included in the NVM 120' in FIG. 10.

Referring to FIG. 11, the MCA 121' may be divided into a meta area MA and a storage area SA. The meta area MA may store a plurality of pieces (e.g., units, instances, articles, or the like) of memory revival firmware FWa, FWb, and FWc. In addition, the meta area MA may include a plurality of mapping tables that store mapping information about user data to be stored in the storage area SA. In addition, the storage area SA may be physically or logically divided into various units. For example, the storage area SA may include a plurality of planes PL1 and PL2, and each of the plurality of planes PL1 and PL2 may include a plurality of blocks BLK1 and BLK2. Each of the plurality of blocks BLK1 and BLK2 may be an erase unit of the NVM 120'.

Figure 12:
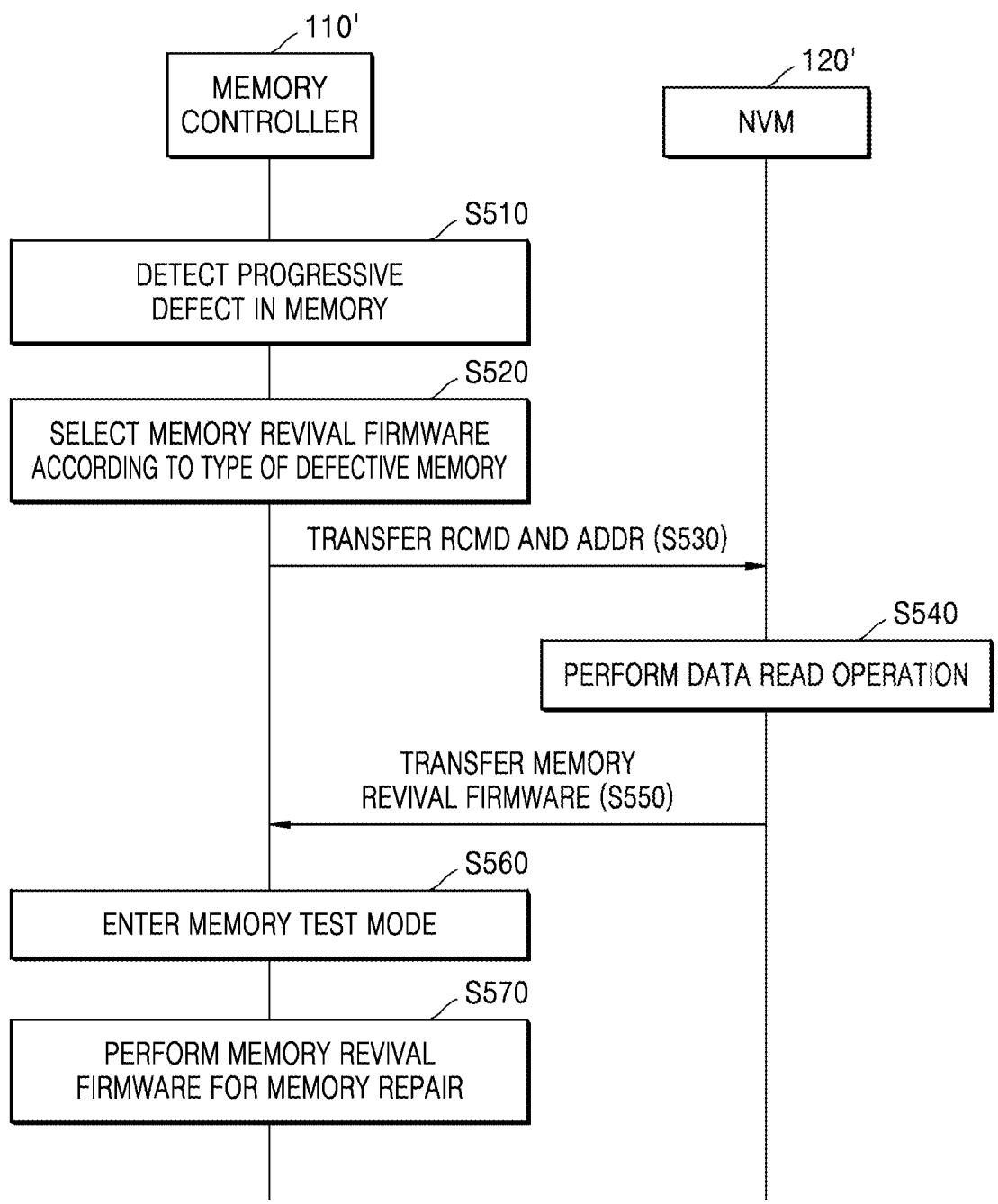
FIG. 12 is a flowchart illustrating an operation between a memory controller and a non-volatile memory, according to some example embodiments.

FIG. 12 is a flowchart illustrating an operation between the memory controller 110' and the NVM 120', according to some example embodiments.

Referring to FIGS. 10 through 12 together, the memory controller 110' may detect a progressive defect in the memory (S510). Restated, the memory controller 110' may determine that a progressive defect has occurred in a memory that is at least one of NVM 120', the VM 130', or the memory 111'. For example, the memory controller 110' may detect the UECC in the NVM 120', the VM 130', or the memory 111'. The memory controller 110' may select memory revival firmware FW according to a type of the defective memory (S520), for example in response to the detecting at S510. For example, the memory controller 110' may select one of the plurality of pieces of memory revival firmware FW stored in the NVM 120' (e.g., select a particular memory revival firmware FW among the plurality of pieces of memory revival firmware FW) according to the type of the defective memory.

The memory controller 110' may transfer a read command RCMD and the address ADDR to the NVM 120' for reading the memory revival firmware FW (S530), for example in response to the detecting at S510 and/or the selecting at S520. Such read command RCMD and the address ADDR may indicate a particular memory revival firmware FW according to a type or attribute of the memory in which the progressive defect has occurred (e.g., the defective memory). The NVM 120' may perform the data read operation (S540), for example in response to the transfer at S530. For example, the NVM 120' may read the selected (e.g., particular) memory revival firmware FW by performing the read operation on the meta area MA of the MCA 121'.

The NVM 120' may transfer the read (e.g., particular, selected) memory revival firmware FW to the memory controller 110' (S550), for example in response to the performing of the data read operation at S540. Accordingly, the memory controller 110' may receive the memory revival firmware FW from the NVM 120' in response to the determination that the progressive defect has occurred at S510. Accordingly, the NVM 120' may be configured to transfer the memory revival firmware FW to the memory controller 110' in response to the determination that the progressive defect has occurred at S510. Where the NVM 120' stores a plurality of pieces of memory revival firmware FW, as noted above, the transfer S550 may include transferring the particular memory revival firmware FW selected at S520, such that the memory controller 110' receives (e.g., downloads) the particular memory revival firmware FW from among the plurality of pieces of memory revival firmware FW according to a type or attribute of the memory in which the progressive defect has occurred. For example, the memory controller 110' may load the received memory revival firmware FW in the memory 111' or the VM 130'. The memory controller 110' may enter the memory test mode (S560), for example in response to the transfer at S550, the detecting at S510, and/or the selecting S520. For example, the memory test mode may correspond to a memory revivable firmware loadable mode. In some example embodiments, operation S560 may be performed ahead of operation S550.

The memory controller 110' may execute the memory revival firmware FW for the memory repair (S570), for example in response to the entering the memory test mode at S560, the detecting at S510, the transfer at S550, and/or the selecting at S520. For example, the memory controller 110' may repair the defective memory based on executing the memory revival firmware FW downloaded to the memory 111'.

Figure 13:
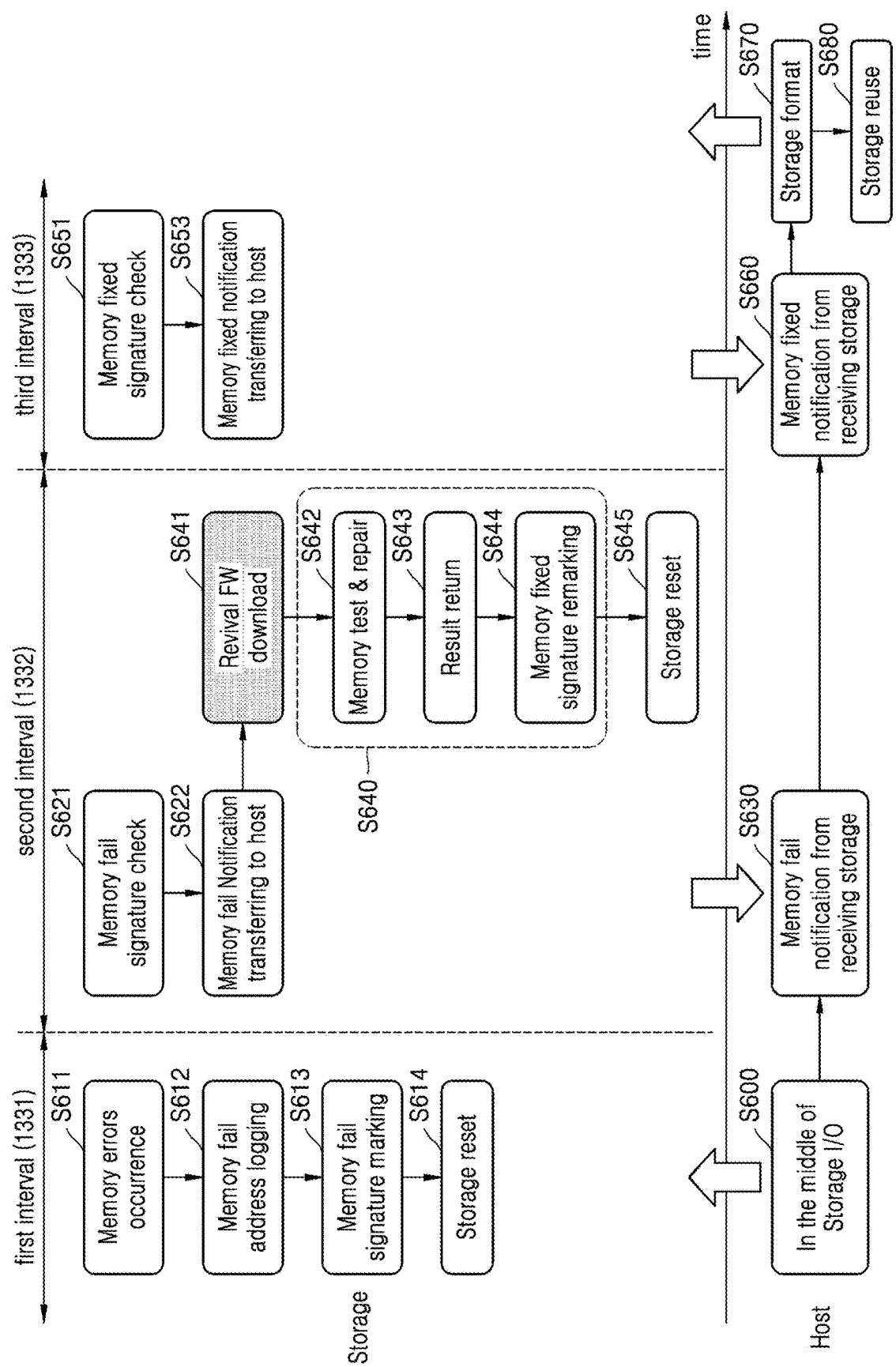
FIG. 13 is a flowchart illustrating an operation between a host and a storage device, according to some example embodiments.

FIG. 13 is a flowchart illustrating an operation between a host and a storage device, according to some example embodiments.

Referring to FIG. 13, the host may correspond to, for example, the host 200 in FIG. 1, and the storage may correspond to, for example, the storage device 100 in FIG. 1. The descriptions given above with reference to FIGS. 1 through 12 may also be applied to some example embodiments, and duplicate descriptions are omitted. Hereinafter, an example of the operation between the host and the storage over time is described. The host may be in the middle of performing a data input/output operation on the storage (S600). For example, the host may transfer a write request or read request to the storage, and the storage may write data or read data in response to the write request or read request, respectively.

In a first interval 1331, a memory error may occur in the storage (S611). For example, the ECC engine included in the storage may detect a UECC in an NVM or a VM. The storage may record a memory fail address, that is, a memory defective address (S612), for example in response to the error occurrence at S611. For example, the memory fail address may include a physical address. However, the inventive concepts are not limited thereto, and the memory fail address may include a logical address. Next, the storage may mark a memory fail signature (S613), for example in response to the recording at S612. For example, the storage may mark the memory fail signature on a particular area of the NVM or a particular area of SRAM. Next, the storage may be reset (S614), for example in response to the marking at S613. Accordingly, the first interval 1331 may be referred to as a first reset interval or a first reset cycle. For example, the storage may perform operations S611 through S614 based on executing main firmware.

When the storage is reset (e.g., in response to the storage being reset at S614), a second interval 1332 may start. In the second interval 1332, the storage may enter a failure mode or a memory test mode. First, the storage may check the memory fail signature (S621). Next, the storage may transfer a memory fail notification to the host (S622), for example in response to the checking at S621, and the host may receive a memory fail notification from the storage (S630), for example in response to the transfer at S622. The storage may download the memory revival firmware (S641). The downloading at S641 may be performed in response to any of the preceding operations S611 to S630. In some example embodiments, a memory controller of the storage (for example, 110 in FIG. 1) may receive the memory revival firmware FW from the host. In some example embodiments, a memory controller of the storage (for example, 110' in FIG. 11) may receive the memory revival firmware FW from an NVM (for example, 120' in FIG. 10).

The storage may execute the memory revival firmware FW to repair a memory error (S640), for example in response to the downloading at S641. The storage may perform a test and repair operation on a memory (S642), return a result thereof (S643), and re-mark a memory fixed signature (S644). For example, the memory fixed signature indicates that the repair operation on the defect memory is completed. For example, the storage may change a memory fail signature to the memory fixed signature. For example, when the memory fail signature is logic '1' (e.g., in response to the memory fail signature being logic '1', the memory fixed signature may be logic '0'. Subsequently, the storage may be reset (S645), for example in response to the performing the repair at S640. Accordingly, the second interval 1332 may be referred to as a second reset interval or a second reset cycle. For example, the storage may perform operations S621 through S645 based on executing the main firmware.

When the storage is reset (e.g., in response to a determination that the storage is reset at S645), a third interval 1333 may start. In the third interval 1333, the storage may enter a failure mode or a memory test mode. First, the storage may check the memory fixed signature (S651). Next, the storage may transfer the memory fixed notification to the host (S653), for example in response to the checking at S651, and the host may receive the memory fixed notification from the storage (S660), for example in response to the transfer at S653. For example, the storage may perform operations S651 through S653 based on executing the main firmware. Next, the host may format the storage (S670), and reuse the storage (S680), for example in response to the receipt at S660.

It will be understood that an operation being performed in response to a preceding operation may include performing the operation in response to a result of the preceding operation.

Figure 14:
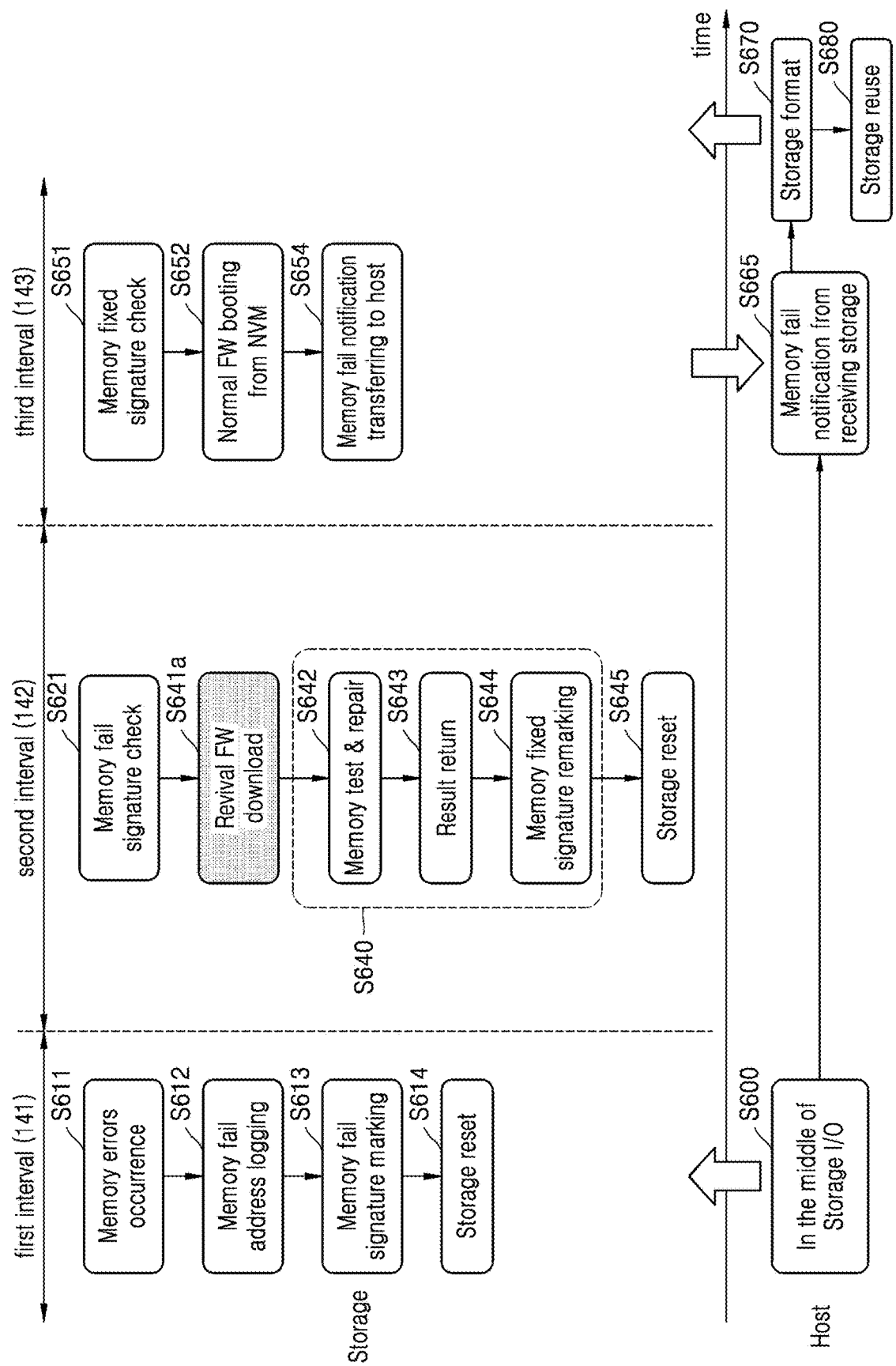
FIG. 14 is a flowchart illustrating an operation between a host and a storage device, according to some example embodiments.

FIG. 14 is a flowchart illustrating an operation between a host and a storage, according to some example embodiments.

Referring to FIG. 14, the host may correspond to, for example, the host 200 in FIG. 1, and the storage may correspond to, for example, the storage device 100 in FIG. 1. An operation between the host and the storage according to some example embodiments may correspond to a modified example of the operation between the host and the storage illustrated in FIG. 13. Accordingly, the descriptions given above with reference to FIG. 13 may also be applied to some example embodiments, and duplicate descriptions are omitted. The host may be in the middle of performing a data input/output operation on the storage (S600). An operation of the storage device in a first interval 141 may be performed the same or substantially the same as the operation of the storage in the first interval 1331 in FIG. 13.

When the storage is reset (e.g., in response to the storage being reset at S614), a second interval 142 may start. In the second interval 142, the storage may enter a failure mode or a memory test mode. First, the storage may check the memory fail signature (S621). As a result of checking the memory fail signature (e.g., in response to a result of the checking), in some example embodiments of the memory fail, the storage may download the memory revival firmware FW (S641a). In some example embodiments, a memory controller of the storage (for example, 110' in FIG. 10) may receive the memory revival firmware FW from the NVM (for example, 120' in FIG. 10). For example, the storage may perform operations S621 and S641a based on executing an ROM code. The storage may execute the memory revival firmware FW to repair a memory error (S640). The storage may perform a test and repair operation on a memory (S642), return a result thereof (S643), and re-mark the memory fixed signature. Subsequently, the storage may be reset (S645).

When the storage is reset, (e.g., in response to the storage being reset at S645) a third interval 143 may start. In the third interval 143, the storage may check the memory fixed signature (S651). As a result of checking the memory fixed signature, when the memory has been fixed (e.g., in response to the memory being fixed), the storage may be booted by receiving a normal firmware from the NVM (S652). For example, the storage may perform operations S651 and S652 based on executing the ROM code. Next, the storage may transfer the memory fail notification to the host (S654), and the host may receive the memory fail notification from the storage (S665). For example, the storage may perform operation S654 based on executing the main firmware. Next, the host may format the storage (S670), and reuse the storage (S680).

Figure 15:
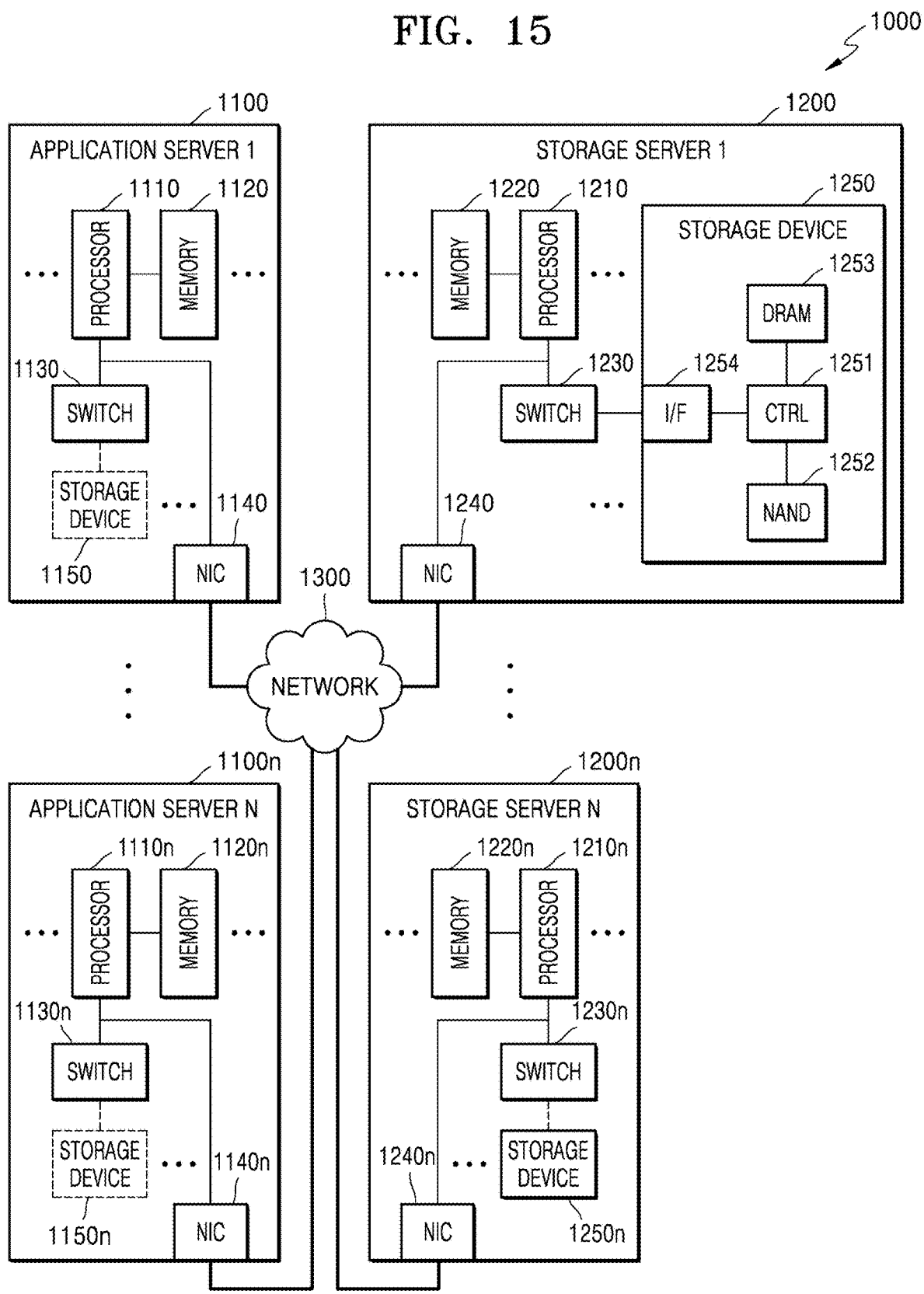
FIG. 15 illustrates a network system according to some example embodiments.

FIG. 15 illustrates a network system 1000 according to some example embodiments.

Referring to FIG. 15, the network system 1000 may be a facility that collects various data and provides services, and may also be referred to as a data center or data storage center. The network system 1000 may include application servers 1100 through 1100n and storage servers 1200 through 1200n, and the application servers 1100 through 1100n and the storage servers 1200 through 1200n may be referred to as computing nodes. The number of application servers 1100 through 1100n and the number of storage servers 1200 through 1200n may be variously selected according to some example embodiments, and the number of application servers 1100 through 1100n and the number of storage servers 1200 through 1200n may be different from each other.

The application servers 1100 through 1100n and the storage servers 1200 through 1200n may communicate with each other via a network 1300. The network 1300 may be implemented by using fiber channel (FC), Ethernet, or the like. In some example embodiments, the FC may be a medium used for high speed data transfer, and may use an optical switch providing high performance/high availability. According to an access method of the network 1300, the storage servers 1200 through 1200n may be provided as file storages, block storages, or object storages.

In some example embodiments, the network 1300 may include a storage-dedicated network such as a storage area network (SAN). For example, the SAN may include a fiber channel (FC) SAN FC-SAN implemented according to FC protocol (PCP) by using an FC network. In some example embodiments, the SAN may include an internet protocol (IP) SAN (IP SAN) implemented according to an internet (i) small computer system interface (SCSI) (iSCSI) (that is, SCSI over transmission control protocol (TCP)/IP (TCP/IP) or internet SCSI) protocol by using a TCP/IP network. In some example embodiments, the network 1300 may include a general network such as the TCP/IP network. For example, the network 1300 may be implemented according to protocols such as FC over Ethernet (FCoE), network-attached storage (NAS), NVMe over fabrics (oF) (NVMe-oF), or the like.

Hereinafter, the application server 1100 and the storage server 1200 are mainly described. Descriptions of the application server 1100 may be applied to other application servers (for example, 1100n), and descriptions of the storage server 1200 may be applied to other storage servers (for example, 1200n).

The application server 1100 may include at least one of the processor 1110 or the memory 1120. The processor 1110 may control the overall operation of the application server 1100, and access the memory 1120 to execute commands and/or data loaded in the memory 1120. According to some example embodiments, the number of processors 1110 and the number of memories 1120 included in the application server 1100 may be variously selected. In some example embodiments, the processor 1110 and the memory 1120 may provide a processor-memory pair. In some example embodiments, the number of processors 1110 and the number of memories 1120 may be different from each other.

The application server 1100 may further include a storage device 1150. In some example embodiments, the number of storage devices 1150 included in the application server 1100 may be variously selected, according to some example embodiments. The processor 1110 may provide a command to the storage device 1150, and the storage device 1150 may generate device information in response to a command received from the processor 1110, or by itself, and the generated device information may be provided to the processor 1110. However, the inventive concepts are not limited thereto, and the application server 1100 may not include the storage device 1150.

The application server 1100 may further include a switch 1130 and a network interface card (NIC) 1140. The switch 1130 may selectively connect the processor 1110 to the storage device 1150 under the control of the processor 1110, or may selectively connect the NIC 1140 to the storage device 1150. The NIC 1140 may include a wired interface, a wireless interface, a Bluetooth interface, an optical interface, or the like. In some example embodiments, the processor 1110 and the NIC 1140 may be integrated into one body. In some example embodiments, the storage device 1150 and the NIC 1140 may be integrated into one body.

The application server 1100n may include at least one of the processor 1110n or the memory 1120n. The application server 1100n may further include a storage device 1150n. The application server 1100n may further include a switch 1130n and a network interface card (NIC) 1140n.

The application server 1100 may store data requested by a user or client in one of the storage servers 1200 through 1200n via the network 1300. In addition, the application server 1100 may obtain data requested to be read by the user or client from one of the storage servers 1200 through 1200n via the network 1300. For example, the application server 1100 may be implemented as a web server or a database management system (DBMS).

The application server 1100 may access the memory 1120n or the storage device 1150n included in another application server 1100n via the network 1300, or access the memories 1220 through 1220n or the storage devices 1250 through 1250n included in the storage servers 1200 through 1200n via the network 1300, respectively. Accordingly, the application server 1100 may perform various operations on data stored in the application servers 1100 through 1100n and/or the storage servers 1200 through 1200n. For example, the application server 1100 may execute a command for moving or copying data between the application servers 1100 through 1100n and/or the storage servers 1200 through 1200n.

The storage server 1200 may include at least one of the processor 1210 or the memory 1220. The processor 1210 may control the overall operation of the storage server 1200, and access the memory 1220 to execute commands and/or data loaded in the memory 1220. According to some example embodiments, the number of processors 1210 and the number of memories 1220 included in the storage server 1200 may be variously selected. In some example embodiments, the processor 1210 and the memory 1220 may include a processor-memory pair. In some example embodiments, the number of processors 1210 and the number of memories 1220 may be different from each other.

The processor 1210 may include a single-core processor or a multi-core processor. For example, the processor 1210 may include a general-purpose processor, a central processing unit (CPU), a graphic processing unit (GPU), a digital signal processor (DSP), a microcontroller (MCU), a microprocessor, a network processor, an embedded processor, field programmable gate array (FPGA), an application-specific instruction set processor (ASIP), and application-specific integrated circuit (ASIC) processor, etc. For example, the processor 1210 may be packaged in a common processor package, a multi-core processor package, a system-on-chip (SoC) package, a system-in-package (SiP) package, a system-on-package (SOP) package, etc.

The storage server 1200 may further include at least one storage device 1250. The number of storage devices 1250 included in the storage server 1200 may be variously selected according to some example embodiments. The storage device 1250 may include a controller (CTRL) 1251, a NAND flash 1252, a DRAM 1253, and an interface (I/F) 1254. Hereinafter, the configuration and operation of the storage device 1250 are described in detail. The following description of the storage device 1250 may be applied to other storage devices 1150 through 1150n and 1250 through 1250n.

The interface 1254 may provide a physical connection of the processor 1210 to the controller 1251 and a physical connection of the NIC 1240 to the controller 1251. For example, the I/F 1254 may be implemented in a direct attached storage (DAS) method of directly connecting the storage device 1250 to a dedicated cable. In addition, for example, the I/F 1254 may be implemented in various interface methods such as advanced technology attachment (ATA), serial ATA (SATA), external SATA (e-SATA), small computer system interface (SCSI), serial attached SCSI (SAS), peripheral component interconnect (PCI), PCI express (PCIe), node version manager (NVM) express (NVMe), IEEE 1394, universal serial bus (USB), a secure digital (SD) card, a multi-media card (MMC), an embedded multi-media card (eMMC), and a compact flash (CF) card.

The controller 1251 may control the overall operation of the storage device 1250. In some example embodiments, the controller 1251 may include SRAM. The controller 1251 may write data to the NAND flash 1252 in response to a write command, or may read data from the NAND flash 1252 in response to a read command. For example, the write command and/or read command may be provided by the processor 1210 in the storage server 1200, the processor 1210n in another storage server 1200n, or the processors 1110 through 1110n in the application servers 1100 through 1100n, respectively.

The NAND flash 1252 may include a plurality of NAND flash memory cells. However, the inventive concepts are not limited thereto, and the storage device 1250 may include other NVM except the NAND flash 1252, for example, resistive RAM (ReRAM), phase change RAM (PRAM), or magnetic RAM (MRAM), or a magnetic storage medium or an optical storage medium, or the like.

DRAM 1253 may be used as a buffer memory. For example, the DRAM 1253 may be double data rate (DDR) SRAM (DDR SDRAM), low power DDR (LPDDR) SDRAM, graphics DDR (GDDR) SDRAM, rambus DRAM (RDRAM), or high bandwidth memory (HBM). However, the inventive concepts are not limited thereto, and the storage device 1250 may use VM other than DRAM or NVM as a buffer memory.

However, the configuration of the storage device 1250 is not limited to the descriptions given above, and may include various memories such as DRAM, SDRAM, hard disk drive (HDD), solid-state drive (SSD), redundant array of independent disk (RAID) volume, non-volatile dual in-line memory module (NVDIMM), network attached storage (NAS), a flash memory such as a planar NAND flash memory, a three-dimensional (3D) NAND flash memory, and an NOR flash memory, a 3D crosspoint memory, non-volatile MRAM (NVMRAM), ReRAM, PRAM, FRAM, ReRAM, and a memristor, or a combination thereof.

The storage server 1200 may further include a switch 1230 and the NIC 1240. The switch 1230 may selectively connect the processor 1210 to the storage device 1250 under the control of the processor 1210, or selectively connect the NIC 1240 to the storage device 1250. In some example embodiments, the processor 1210 and the NIC 1240 may be integrated into one body. In some example embodiments, the storage device 1250 and the NIC 1240 may be integrated into one body.

The storage devices 1150 through 1150*n* and 1250 through 1250*n* may be implemented according to some example embodiments described above with reference to FIGS. 1 through 14. According to some example embodiments of the inventive concepts, the controller 1251 of the storage device 1250 may include SRAM, and the storage device 1250 may detect the UECC in SRAM, the NAND flash 1252, and/or the DRAM 1253. In some example embodiments, the storage device 1250 may provide information about the detected UECC to the application server 1100 via the network 1300. The application server 1100 may generate a revival command so that the storage device 1250 enters a revival mode according to the information about the detected UECC, and provide the generated revival command to the storage device 1250 via the network 1300. In some example embodiments, the application server 1100 may provide the memory revival firmware FW to the storage device 1250.

The storage device 1250 may execute the memory revival firmware FW in response to the revival command to regenerate the defective memory in SRAM, the NAND flash 1252 and/or the DRAM 1253. The storage device 1250 may identify the defective cells in SRAM, the NAND flash 1252, and/or the DRAM 1253, analyze defective attributes, and perform the repair operation on the defective cells. In some example embodiments, the storage device 1250 may execute the memory revival firmware FW received from the application server 1100. However, the inventive concepts are not limited thereto, and the storage device 1250 may execute the memory revival firmware FW previously stored in the NAND flash 1252.

The storage server 1200*n* may include a processor 1210*n* and/or memory 1220*n*, switch 1230*n*, storage device 1250*n*, and NIC 1240*n*.

While the inventive concepts have been particularly shown and described with reference to some example embodiments thereof, it will be understood that various changes in form and details may be made therein without departing from the spirit and scope of the following claims.

What is claimed is:

1. A storage device, comprising:
a non-volatile memory;
a volatile memory; and
a memory controller configured to control the non-volatile memory and the volatile memory,
the memory controller further configured to, in response to a determination that a progressive defect has occurred in at least one memory of the non-volatile memory or the volatile memory during an operation of the storage device, such that the at least one memory is determined to be a defective memory, download a memory revival firmware to the memory controller and perform a repair operation on the defective memory based on executing the memory revival firmware.

2. The storage device of claim 1, wherein the memory controller is further configured to
transfer information associated with the progressive defect to a host in response to the determination that the progressive defect has occurred, and
the memory controller is further configured to download the memory revival firmware from the host to the memory controller.

3. The storage device of claim 2, wherein
the information associated with the progressive defect includes information associated with a type or attribute of the defective memory, and
the memory controller is further configured to download, from the host, the memory revival firmware based on the memory revival firmware being a particular memory revival firmware corresponding to the type or attribute of the defective memory.

4. The storage device of claim 1, wherein
the non-volatile memory is configured to store the memory revival firmware, and
the memory controller is configured to download the memory revival firmware from the non-volatile memory to the memory controller in response to the determination that the progressive defect has occurred and execute the downloaded memory revival firmware.

5. The storage device of claim 4, wherein
the non-volatile memory is configured to store a plurality of pieces of memory revival firmware, and
the memory controller is configured to download the memory revival firmware as a particular memory revival firmware from among the plurality of pieces of memory revival firmware according to a type or attribute of the defective memory.

6. The storage device of claim 1, wherein
the memory revival firmware includes first memory revival firmware, and
the memory controller is further configured to perform the repair operation based on executing the first memory revival firmware in response to a determination that the progressive defect has occurred in the non-volatile memory.

7. The storage device of claim 6, wherein
the memory revival firmware further comprises second memory revival firmware different from the first memory revival firmware, and
the memory controller is further configured to perform the repair operation based on executing the second memory revival firmware in response to a determination that the progressive defect has occurred in the volatile memory.

8. The storage device of claim 1, wherein
the memory revival firmware includes first memory revival firmware, and the memory controller is configured to perform the repair operation based on executing the first memory revival firmware in response to a determination that the progressive defect has occurred in the volatile memory or the non-volatile memory.

9. The storage device of claim 1, wherein the memory controller is configured to perform the repair operation based on replacing at least one defective cell among a plurality of memory cells comprised in the defective memory with a redundancy cell.

10. An operating method of a storage device, the storage device including a non-volatile memory, a volatile memory, and a memory controller, the operating method comprising:
   detecting, by the memory controller, a progressive defect in a memory of the non-volatile memory or the volatile memory, such that the memory in which the progressive defect is detected is determined to be a defective memory;
   entering, by the memory controller, a memory test mode and downloading a memory revival firmware to the memory controller in response to the detecting the progressive defect; and
   performing, by the memory controller, a repair operation on the defective memory based on executing the memory revival firmware in the memory test mode.

11. The operating method of claim 10, further comprising:
   in response to the detection of the progressive defect, transferring, by the memory controller, information associated with the progressive defect to a host; and
   downloading, by the memory controller, the memory revival firmware from the host to the memory controller, where the memory revival firmware is downloaded by the memory controller based on the information associated with the progressive defect having been transferred to the host,
   wherein the executing of the repair operation includes executing the memory revival firmware downloaded from the host to the memory controller.

12. The operating method of claim 10, further comprising:
   in response to the detection of the progressive defect, downloading, by the memory controller, the memory revival firmware from the non-volatile memory to the memory contoller,
   wherein the executing of the repair operation includes executing the memory revival firmware downloaded from the non-volatile memory to the memory controller.

13. The operating method of claim 10, wherein the memory revival firmware is configured to execute both a repair operation on the non-volatile memory and a repair operation on the volatile memory.

14. The operating method of claim 10, wherein the memory revival firmware includes
   first memory revival firmware configured to execute a first repair operation on the non-volatile memory; and
   a second memory revival firmware configured to execute a second repair operation on the volatile memory.

15. A memory controller configured to control a memory, the memory controller comprising:
   a memory interface configured to transceive data with the memory;
   an error checking and correcting (ECC) engine configured to correct an error of data read from the memory; and
   memory revival firmware configured to perform a repair operation on the memory in response to a determination, by the memory controller, that an uncorrectable error has occurred in the memory, the uncorrectable error being an error that the ECC engine is not capable of correcting,
   wherein the memory controller is configured to download the memory revival firmware to the memory controller in response to the determination that the uncorrectable error has occurred in the memory.

16. The memory controller of claim 15, wherein
   the memory includes a non-volatile memory, and
   the memory revival firmware is configured to perform a repair operation on the non-volatile memory.

17. The memory controller of claim 16, wherein the memory revival firmware is configured to be downloaded by the memory controller from the non-volatile memory to the memory controller via the memory interface.

18. The memory controller of claim 15, wherein
   the memory includes a volatile memory, and
   the memory revival firmware is configured to perform a repair operation on the volatile memory.

19. The memory controller of claim 15, further comprising:
   a host interface configured to communicate with a host,
   wherein the memory revival firmware is configured to be downloaded from the host to the memory controller via the host interface.

20. The memory controller of claim 15, further comprising:
   an internal memory,
   wherein the memory revival firmware is loaded in the internal memory.

* * * * *